US012689353B2

(12) United States Patent
Daimon

(10) Patent No.: US 12,689,353 B2
(45) Date of Patent: Jul. 21, 2026

(54) ACOUSTIC WAVE DEVICE

(71) Applicant: Murata Manufacturing Co., Ltd.,
Nagaokakyo (JP)

(72) Inventor: Katsuya Daimon, Nagaokakyo (JP)

(73) Assignee: **MURATA MANUFACTURING CO.,
LTD.**, Kyoto (JP)

( * ) Notice: Subject to any disclaimer, the term of this
patent is extended or adjusted under 35
U.S.C. 154(b) by 1151 days.

(21) Appl. No.: 17/705,990

(22) Filed: Mar. 28, 2022

(65) Prior Publication Data

US 2022/0224311 A1      Jul. 14, 2022

Related U.S. Application Data

(63) Continuation of application No.
PCT/JP2020/036099, filed on Sep. 24, 2020.

(30) Foreign Application Priority Data

Sep. 30, 2019    (JP) ................................. 2019-178247

(51) Int. Cl.
*H03H 9/17*         (2006.01)
*H03H 9/02*         (2006.01)
(Continued)

(52) U.S. Cl.
CPC ........ *H03H 9/173* (2013.01); *H03H 9/02031*
(2013.01); *H03H 9/02086* (2013.01);
(Continued)

(58) Field of Classification Search
CPC ........... H03H 9/02559; H03H 9/02574; H03H
9/1457; H03H 9/02118; H03H 9/13;
(Continued)

(56) References Cited

U.S. PATENT DOCUMENTS

| 2017/0222619 A1 | 8/2017 | Iwamoto et al. |
| 2018/0062612 A1 | 3/2018 | Daimon et al. |

(Continued)

FOREIGN PATENT DOCUMENTS

| CN | 107534428 A | 1/2018 |
| JP | 2018-174595 A | 11/2018 |

(Continued)

OTHER PUBLICATIONS

Translation WO-2019177028-A1 (Year: 2025).*

(Continued)

*Primary Examiner* — J. T. Newton
(74) *Attorney, Agent, or Firm* — Keating & Bennett, LLP

(57) ABSTRACT

An acoustic wave device includes a high-acoustic-velocity
film, a low-acoustic-velocity film, a piezoelectric layer
including lithium tantalate, and an IDT electrode on the
piezoelectric layer. The IDT electrode includes first and
second busbars and first and second electrode fingers. An
intersecting region is a portion where the first and second
electrode fingers overlap in an acoustic wave propagation
direction. The intersecting region includes a central region
and first and second edge regions. The IDT electrode
includes first and second gap regions outside the first and
second edge regions. The first and second electrode fingers
are wider in the first and second edge regions than in the
central region. A duty ratio in the first and second edge
regions is from about 0.62 to about 0.73.

20 Claims, 6 Drawing Sheets

(51) Int. Cl.
    *H03H 9/13*          (2006.01)
    *H03H 9/58*          (2006.01)

(52) U.S. Cl.
    CPC ........ *H03H 9/02559* (2013.01); *H03H 9/131*
               (2013.01); *H03H 9/585* (2013.01)

(58) Field of Classification Search
    CPC .............. H03H 9/171; H03H 9/14541; H03H
                      9/02818; H03H 9/25
    See application file for complete search history.

(56) References Cited

U.S. PATENT DOCUMENTS

| | | | |
|---|---|---|---|
| 2019/0149125 A1 | 5/2019 | Saji | |
| 2019/0165764 A1 | 5/2019 | Taniguchi | |
| 2019/0319603 A1 | 10/2019 | Kadota et al. | |
| 2020/0403603 A1 | 12/2020 | Daimon et al. | |
| 2022/0224311 A1* | 7/2022 | Daimon | H03H 9/173 |

FOREIGN PATENT DOCUMENTS

| | | | |
|---|---|---|---|
| JP | 2019-091978 A | 6/2019 | |
| JP | 2019-097155 A | 6/2019 | |
| WO | 2016/170982 A1 | 10/2016 | |
| WO | 2018/097016 A1 | 5/2018 | |
| WO | WO-2019177028 A1* | 9/2019 | H03H 9/6496 |

OTHER PUBLICATIONS

Official Communication issued in International Patent Application No. PCT/JP2020/036099, mailed on Nov. 17, 2020.
Official Communication issued in corresponding Chinese Patent Application No. 202080066169.0, mailed on Jan. 9, 2026, 7 pages.

* cited by examiner

ACOUSTIC WAVE DEVICE

CROSS REFERENCE TO RELATED APPLICATIONS

This application claims the benefit of priority to Japanese Patent Application No. 2019-178247 filed on Sep. 30, 2019 and is a Continuation application of PCT Application No. PCT/JP2020/036099 filed on Sep. 24, 2020. The entire contents of each application are hereby incorporated herein by reference.

BACKGROUND OF THE INVENTION

1. Field of the Invention

The present invention relates to an acoustic wave device.

2. Description of the Related Art

Heretofore, acoustic wave devices have been widely used in filters of mobile phone devices and so forth.

Japanese Unexamined Patent Application Publication No. 2018-174595 describes an acoustic wave device that includes a high-acoustic-velocity support substrate, a low-acoustic-velocity film stacked on the high-acoustic-velocity support substrate, a piezoelectric film stacked on the low-acoustic-velocity film and composed of lithium tantalate, and an interdigital transducer (IDT) electrode provided on the piezoelectric film. The IDT electrode includes busbars and a plurality of electrode fingers connected to the busbars. The plurality of electrode fingers are each provided with a wide portion, which has a width dimension that is larger than that in a central region of the electrode finger in the length direction, in at least one of the base and the tip of the electrode finger relative to the central region of the electrode finger. By providing these wide portions, the acoustic velocity in at least one of the bases and the tips of the electrode fingers is lower than the acoustic velocity in the central regions of the electrode fingers. In this way, a piston mode is utilized in order to suppress a transverse mode ripple. It is disclosed that the duty ratio of the wide portions desirably is in a range of 0.6 to 0.9.

However, in an acoustic wave device having a multilayer structure as described in Japanese Unexamined Patent Application Publication No. 2018-174595, when the disclosed duty ratio is applied as the duty ratio of wide portions, the acoustic velocity may be higher at the bases or tips of the electrode fingers. Therefore, it may be difficult to use a piston mode and it is not possible to sufficiently suppress a transverse mode in some cases.

SUMMARY OF THE INVENTION

Preferred embodiments of the present invention provide acoustic wave devices that are each able to more reliably reduce or prevent a transverse mode.

An acoustic wave device according to a preferred embodiment of the present invention includes a high-acoustic-velocity material layer, a low-acoustic-velocity film on the high-acoustic-velocity material layer, a piezoelectric layer on the low-acoustic-velocity film and made of lithium tantalate, and an IDT electrode on the piezoelectric layer. An acoustic velocity of bulk waves propagating through the high-acoustic-velocity material layer is higher than an acoustic velocity of acoustic waves propagating through the piezoelectric layer. An acoustic velocity of bulk waves propagating through the low-acoustic-velocity film is lower than an acoustic velocity of bulk waves propagating through the piezoelectric layer. The IDT electrode includes a first busbar and a second busbar that face each other, a plurality of first electrode fingers each including one end connected to the first busbar, and a plurality of second electrode fingers each including one end connected to the second busbar and that are interdigitated with the plurality of first electrode fingers. When an acoustic wave propagation direction is a first direction and a direction perpendicular or substantially perpendicular to the first direction is a second direction, a portion of the IDT electrode where the first electrode fingers and the second electrode fingers overlap in the first direction is an intersecting region. The intersecting region includes a central region centrally located in the second direction, a first edge region at a side of the central region near the first busbar, and a second edge region at a side of the central region near the second busbar. The IDT electrode includes a first gap region between the first edge region and the first busbar and a second gap region between the second edge region and the second busbar. The first electrode fingers and the second electrode fingers are wider in at least one region of the first edge region and the second edge region than in the central region. A duty ratio in the first edge region and the second edge region is from about 0.62 to about 0.73.

Acoustic wave devices according to preferred embodiments of the present invention are each able to more reliably reduce or prevent a transverse mode.

The above and other elements, features, steps, characteristics and advantages of the present invention will become more apparent from the following detailed description of the preferred embodiments with reference to the attached drawings.

DETAILED DESCRIPTION OF THE PREFERRED EMBODIMENTS

Hereafter, preferred embodiments of the present invention will be described with reference to the drawings.

The preferred embodiments described in the present specification are illustrative examples and portions and elements of the configurations illustrated in different preferred embodiments can be substituted for one another or combined with one another.

Figure 1:
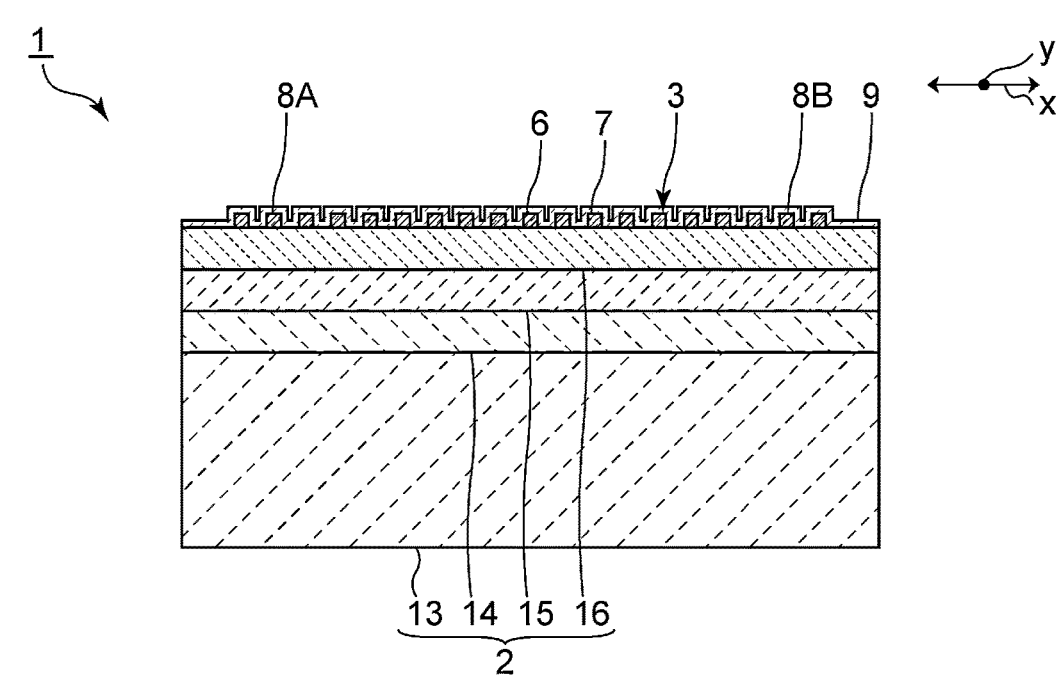
FIG. 1 is a schematic elevational cross-sectional view of an acoustic wave device according to a first preferred embodiment of the present invention.

FIG. 1 is a schematic elevational cross-sectional view of an acoustic wave device according to a first preferred embodiment of the present invention. FIG. 1 illustrates a cross section taken in a central region of an IDT electrode, which is described later.

An acoustic wave device 1 includes a piezoelectric substrate 2. An IDT electrode 3 is provided on the piezoelectric substrate 2. Acoustic waves are excited by applying an alternating-current voltage to the IDT electrode 3. Here, an acoustic wave propagation direction is regarded as a first direction x and a direction perpendicular or substantially perpendicular to the first direction x is regarded as a second direction y. A pair of reflectors including a reflector 8A and a reflector 8B are provided on both sides of the IDT electrode 3 in the acoustic wave propagation direction on the piezoelectric substrate 2. The acoustic wave device 1 of the present preferred embodiment is an acoustic wave resonator, for example. However, an acoustic wave device according to a preferred embodiment of the present invention is not limited to being an acoustic wave resonator, and may be, for example, a filter device including a plurality of acoustic wave resonators, a multiplexer including such a filter device, and so on.

The piezoelectric substrate 2 is a multilayer substrate including a support substrate 13, a high-acoustic-velocity film 14 defining and functioning as a high-acoustic-velocity material layer, a low-acoustic-velocity film 15, and a piezoelectric layer 16 that are stacked in this order. The IDT electrode 3 and the reflector 8A and the reflector 8B are provided on the piezoelectric layer 16.

The piezoelectric layer 16 is, for example, a lithium tantalate layer. More specifically, the lithium tantalate used in the piezoelectric layer 16 is, for example, 50 Y-cut X-propagation LiTaO$_3$. The cut angle and material for the piezoelectric layer 16 are not limited those described above, and for example, lithium niobate, zinc oxide, aluminum nitride, quartz, or lead zirconate titanate (PZT) can also be used.

The low-acoustic-velocity film 15 is a film having a relatively low acoustic velocity. More specifically, the acoustic velocity of bulk waves propagating through the low-acoustic-velocity film 15 is lower than the acoustic velocity of bulk waves propagating through the piezoelectric layer 16. The low-acoustic-velocity film 15 is, for example, a silicon oxide film. The silicon oxide is expressed as SiO$_x$. In the present preferred embodiment, the low-acoustic-velocity film 15 is, for example, a SiO$_2$ film. The material for the low-acoustic-velocity film 15 is not limited to the above material and, for example, a material including glass, silicon oxynitride, tantalum oxide, or a compound obtained by adding fluorine, carbon, or boron to silicon oxide as a main component can be used.

The high-acoustic-velocity material layer is a layer having a relatively high acoustic velocity. More specifically, the acoustic velocity of bulk waves propagating through the high-acoustic-velocity material layer is higher than the acoustic velocity of acoustic waves propagating through the piezoelectric layer 16. The high-acoustic-velocity film 14 defining and functioning as the high-acoustic-velocity material layer is, for example, a silicon nitride film. The material for the high-acoustic-velocity film 14 is not limited to this material and, for example, a medium mainly including any material of silicon, aluminum oxide, silicon carbide, silicon oxynitride, sapphire, lithium tantalate, lithium niobate, quartz, alumina, zirconia, cordierite, mullite, steatite, forsterite, magnesia, a diamond-like carbon (DLC) film, and diamond can be used.

In the present preferred embodiment, the support substrate 13 is, for example, a silicon substrate. The material for the support substrate 13 is not limited to the above material, and, for example, a piezoelectric material such as aluminum oxide, lithium tantalate, lithium niobate, or quartz, any of various ceramic materials such as alumina, magnesia, silicon nitride, aluminum nitride, silicon carbide, zirconia, cordierite, mullite, steatite, or forsterite, a dielectric material such as sapphire, diamond, or glass, a semiconductor such as gallium nitride, or a resin can be used.

As a result of the piezoelectric substrate 2 having a multilayer structure in which the high-acoustic-velocity film 14, the low-acoustic-velocity film 15, and the piezoelectric layer 16 are stacked, the Q value can be increased and the energy of acoustic waves can be effectively confined to the piezoelectric layer 16 side.

A protective film 9 is provided on the piezoelectric substrate 2 to cover the IDT electrode 3. In the present preferred embodiment, the protective film 9 is, for example, a silicon oxide film. However, the material for the protective film 9 is not limited to the above material. The protective film 9 does not necessarily have to be provided. However, the acoustic wave device 1 preferably includes the protective film 9. This makes it less likely that the IDT electrode 3 will be damaged. In addition, in the case where the protective film 9 is a silicon oxide film, the absolute value of the temperature coefficient of frequency TCF can be reduced and the frequency-temperature characteristics can be improved.

Figure 2:
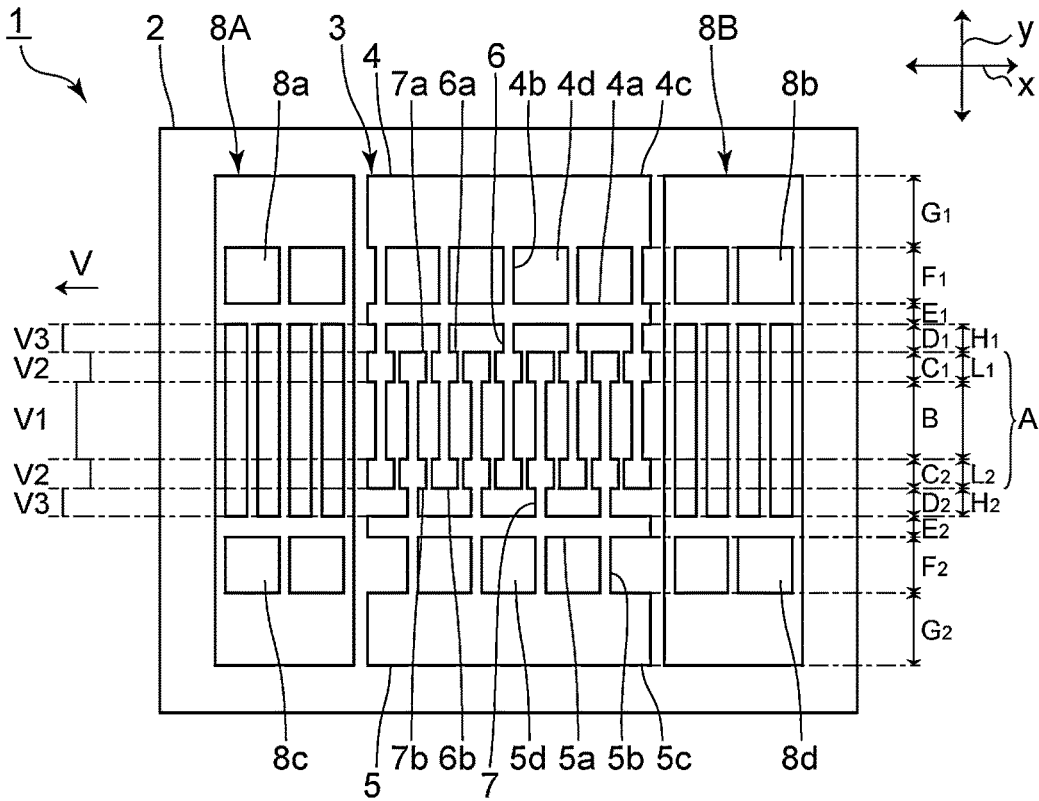
FIG. 2 is a schematic plan view of the acoustic wave device according to the first preferred embodiment of the present invention.

FIG. 2 is a schematic plan view of an acoustic wave device according to the first preferred embodiment. The protective film 9 is omitted from FIG. 2. The protective film 9 may also be omitted from schematic plan views, other than FIG. 2, that will be described later.

The IDT electrode 3 includes a first busbar 4 and a second busbar 5, which face each other. A plurality of first openings 4*d* are provided along the first direction x in the first busbar 4. A plurality of second openings 5*d* are also provided along the first direction x in the second busbar 5. The IDT electrode 3 includes a plurality of first electrode fingers 6 each including one end connected to the first busbar 4. The other ends of the first electrode fingers 6 face the second busbar 5 with gaps therebetween. The IDT electrode 3 includes a plurality of second electrode fingers 7 each including one end connected to the second busbar 5. The other ends of the second electrode fingers 7 face the first busbar 4 with gaps therebetween. The plurality of first electrode fingers 6 and the plurality of second electrode fingers 7 are interdigitated with each other.

The portion of the IDT electrode 3 where the first electrode fingers 6 and the second electrode fingers 7 overlap in the first direction x is referred to as an intersecting region A. The intersecting region A includes a central region B and a first edge region $C_1$ and a second edge region $C_2$. The central region B is located at the center or approximate center of the intersecting region A in the second direction y. The first edge region $C_1$ is disposed at the side of the central region B near the first busbar 4. The second edge region $C_2$ is disposed at the side of the central region B near the second busbar 5. Hereafter, the first edge region $C_1$ and the second edge region $C_2$ may be simply referred to as "edge regions".

The IDT electrode 3 includes a first gap region $D_1$ and a second gap region $D_2$. The first gap region $D_1$ is located between the first edge region $C_1$ and the first busbar 4. The second gap region $D_2$ is located between the second edge region $C_2$ and the second busbar 5.

The first busbar 4 includes a first inner busbar region $E_1$ and a first outer busbar region $G_1$. The first inner busbar region $E_1$ is located at a side of the first busbar 4 near the intersecting region A. The first outer busbar region $G_1$ is located outside the first inner busbar region $E_1$ in the second direction y. In the first busbar 4, the portion located in the first inner busbar region $E_1$ is a first inner busbar portion 4a and the portion located in the first outer busbar region $G_1$ is a first outer busbar portion 4c.

The first busbar 4 includes a first opening forming region $F_1$. The first opening forming region $F_1$ is a region that is located between the first inner busbar region $E_1$ and the first outer busbar region $G_1$ and in which the plurality of first openings 4d are provided. The first busbar 4 includes a plurality of first connecting electrodes 4b. The plurality of first connecting electrodes 4b connect the first inner busbar part 4a and the first outer busbar portion 4c to each other. The plurality of first openings 4d are surrounded by the first inner busbar portion 4a, the first outer busbar portion 4c, and the plurality of first connecting electrodes 4b.

The plurality of first connecting electrodes 4b extend so as to be positioned on lines extending from the plurality of first electrode fingers 6. Here, the widths, i.e., the dimensions along the first direction x, of the connecting electrodes and the electrode fingers are defined as the widths of the connecting electrodes and electrode fingers. The widths of the first connecting electrodes 4b are the same or substantially the same as the widths of the first electrode fingers 6 in the central region B. The arrangement of the plurality of first connecting electrodes 4b is not limited to that described above, and for example, the plurality of first connecting electrodes 4b may extend so as to be positioned on lines extending from the plurality of second electrode fingers 7. The widths of the first connecting electrodes 4b may be different from the widths of the first electrode fingers 6 in the central region B.

Similarly, the second busbar 5 of the IDT electrode 3 includes a second inner busbar region $E_2$, a second outer busbar region $G_2$, and a second opening forming region $F_2$. The portion located in the second inner busbar region $E_2$ is a second inner busbar portion 5a and the portion located in the second outer busbar region $G_2$ is a second outer busbar portion 5c. The plurality of second openings 5d are provided in the second opening forming region $F_2$.

The second busbar 5 includes a plurality of second connecting electrodes 5b. The plurality of second connecting electrodes 5b connect the second inner busbar portion 5a and the second outer busbar portion 5c to each other. The plurality of second openings 5d are surrounded by the second inner busbar portion 5a, the second outer busbar portion 5c, and the plurality of second connecting electrodes 5b. The first busbar 4 and the second busbar 5 do not have to be provided with the first opening forming region $F_1$ and second opening forming region $F_2$.

The reflector 8A also includes a plurality of first openings 8a and a plurality of second openings 8c. The reflector 8B also includes a plurality of first openings 8b and a plurality of second openings 8d. More specifically, the first openings 8a and the first openings 8b of the reflector 8A and the reflector 8B overlap the first openings 4d of the first busbar 4 in the first direction x. The second openings 8c and the second openings 8d of the reflector 8A and the reflector 8B overlap the second openings 5d of the second busbar 5 in the first direction x. Note that the reflector 8A and the reflector 8B do not have to include the first openings 8a or the first openings 8b or the second openings 8c or the second openings 8d.

As illustrated in FIG. 2, the first electrode fingers 6 of the IDT electrode 3 include first wide portions 6a, which are wider than the portions of the first electrode fingers 6 located in the central region B, in the portions of the first electrode fingers 6 located in the first edge region $C_1$. Similarly, the second electrode fingers 7 include first wide portions 7a in the portions of the second electrode fingers 7 located in the first edge region $C_1$. In addition, the first electrode fingers 6 include second wide portions 6b, which are wider than the portions of the first electrode fingers 6 located in the central region B, in the portions of the first electrode fingers 6 located in the second edge region $C_2$. Similarly, the second electrode fingers 7 include second wide portions 7b in the portions of the second electrode fingers 7 located in the second edge region $C_2$.

In the present preferred embodiment, the duty ratio is, for example, about 0.45 in the central region B of the IDT electrode 3. The duty ratio is, for example, from about 0.62 to about 0.73 in the first edge region $C_1$ and the second edge region $C_2$. As a result, the acoustic velocity in the first edge region $C_1$ and the second edge region $C_2$ is lower than the acoustic velocity in the central region B. A first low-acoustic-velocity region $L_1$ is provided in the first edge region $C_1$. A second low-acoustic-velocity region $L_2$ is provided in the second edge region $C_2$.

In the present specification, the first low-acoustic-velocity region $L_1$ and the second low-acoustic-velocity region $L_2$ may also be simply referred to as low-acoustic-velocity regions. The low-acoustic-velocity regions are regions where the acoustic velocity is lower than in the central region B. Here, the acoustic velocity in the central region B is V1 and the acoustic velocity in the first edge region $C_1$ and the second edge region $C_2$ is V2. In the case where the first low-acoustic-velocity region $L_1$ and the second low-acoustic-velocity region $L_2$ are respectively provided in the first edge region $C_1$ and the second edge region $C_2$, as in the present preferred embodiment, V2<V1.

The first electrode fingers 6 and the second electrode fingers 7 are preferably wider in at least one of the first edge region $C_1$ and the second edge region $C_2$ than in the central region B. Accordingly, the duty ratio is preferably, for example, from about 0.62 to about 0.73 in the first edge region $C_1$ and the second edge region $C_2$.

Of the first electrode fingers 6 and the second electrode fingers 7, only the first electrode fingers 6 are provided in the first gap region $D_1$. As a result, the acoustic velocity in the first gap region $D_1$ is higher than the acoustic velocity in the central region B. A first high-acoustic-velocity region $H_1$ is provided in the first gap region $D_1$. Similarly, of the first electrode fingers 6 and the second electrode fingers 7, only the second electrode fingers 7 are provided in the second gap region $D_2$. As a result, the acoustic velocity in the second gap region $D_2$ is higher than the acoustic velocity in the central region B. A second high-acoustic-velocity region $H_2$ is provided in the second gap region $D_2$.

In the present specification, the first high-acoustic-velocity region $H_1$ and the second high-acoustic-velocity region $H_2$ may also be simply referred to as high-acoustic-velocity regions. The high-acoustic-velocity regions are regions where the acoustic velocity is higher than in the central region B. The acoustic velocity in the first gap region $D_1$ and the second gap region $D_2$ is V3. In the case where the first high-acoustic-velocity region $H_1$ and the second high-acous-tic-velocity region $H_2$ are respectively provided in the first gap region $D_1$ and the second gap region $D_2$, as in the present preferred embodiment, V1<V3.

The relationship between the acoustic velocities in these regions is V2<V1<V3. This relationship between the above acoustic velocities is illustrated in FIG. 2. In the portion of FIG. 2 that illustrates the relationship between the acoustic velocities, the further a line indicating the magnitude of an acoustic velocity is toward the left side, the higher the acoustic velocity is, as indicated by the arrow V. This similarly applies to drawings other than FIG. 2. High-acoustic-velocity regions are also respectively provided in the first opening forming region $F_1$ and the second opening forming region $F_2$.

In the present preferred embodiment, the IDT electrode 3 includes a multilayer metal film in which, for example, a Ti layer, an AlCu layer, and a Ti layer are stacked in order from the side of the piezoelectric substrate 2. The Ti layer is an adhesive layer, the AlCu layer is a main electrode layer and the Ti layer is an adhesive layer. The Cu content percentage of the main electrode layer is, for example, less than or equal to about 2 wt %. Here, in the present specification, "main electrode layer" refers to a layer that is about 50% or more of the mass of the IDT electrode.

The material of the reflector 8A and the reflector 8B is the same as the material of the IDT electrode 3.

The materials of the IDT electrode 3, the reflector 8A, and the reflector 8B are not limited to the above-described materials. Alternatively, for example, the IDT electrode 3 may include only a main electrode layer.

Wiring electrodes may be provided on the piezoelectric substrate 2. Portions of the wiring electrodes may be stacked on the first busbar 4 and the second busbar 5 of the IDT electrode 3. In this case, the IDT electrode 3 would be electrically connected to the outside via the wiring electrodes.

The acoustic wave device 1 of the present preferred embodiment has the following features. 1) The first electrode fingers 6 and the second electrode fingers 7 of the IDT electrode 3 respectively include the first wide portions 6a and the first wide portions 7a and the second wide portions 6b and the second wide portions 7b in the first edge region $C_1$ and the second edge region $C_2$. 2) The duty ratio is, for example, from about 0.62 to about 0.73 in the first edge region $C_1$ and the second edge region $C_2$. Consequently, the acoustic velocity in the low-acoustic-velocity regions can be more reliably lowered. Thus, a piston mode can be more reliably established and a transverse mode can be more reliably reduced or prevented. This will be explained in detail hereafter by comparing the present preferred embodiment and a first comparative example and a second comparative example.

A plurality of acoustic wave devices of the first comparative example were prepared. The first comparative example differs from the first preferred embodiment in that the piezoelectric substrate is a piezoelectric substrate including only a piezoelectric layer. The piezoelectric substrate in the first comparative example is a lithium niobate substrate. The plurality of acoustic wave devices of the first comparative example have different duty ratios in the edge regions of the IDT electrodes. In the plurality of acoustic wave devices, an acoustic velocity ratio V2/V1 of an acoustic velocity V2 in the edge regions to an acoustic velocity V1 in the central region was investigated.

Figure 3:
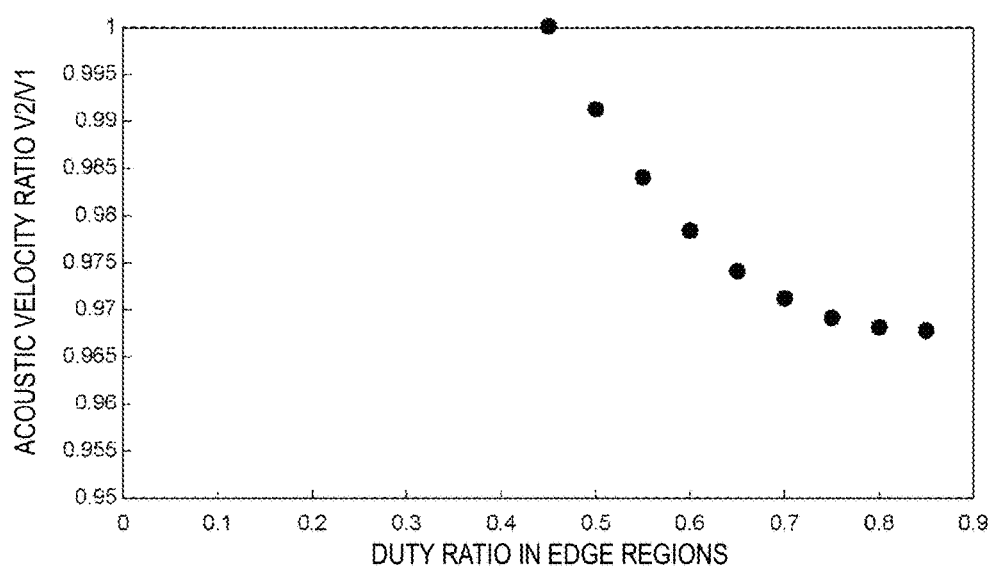
FIG. 3 is a diagram illustrating a relationship between the duty ratio in edge regions of an IDT electrode and an acoustic velocity ratio V2/V1 for acoustic wave devices of a first comparative example.

FIG. 3 is a diagram illustrating the relationship between the duty ratio in the edge regions of the IDT electrode and an acoustic velocity ratio V2/V1 for the acoustic wave devices of the first comparative example. The duty ratio in the central region was about 0.45.

As illustrated in FIG. 3, in the case where the piezoelectric substrate includes only a piezoelectric layer, it can be seen that the acoustic velocity ratio V2/V1 decreases as the duty ratio in the edge regions increases. In the case illustrated in FIG. 3, the acoustic velocity V1 in the central region is constant or substantially constant. Therefore, the larger the duty ratio in the edge regions, the lower the acoustic velocity V2 in the edge regions. Thus, in the case where the piezoelectric substrate includes only a piezoelectric layer, it is clear that the above-described problem in which the acoustic velocity V2 in the edge regions increases as the duty ratio increases does not occur.

A plurality of acoustic wave devices having the same or substantially the same configuration as the first preferred embodiment and a plurality of acoustic wave devices of a second comparative example were prepared. The acoustic wave devices of the second comparative example differ from the first preferred embodiment in that the duty ratio in the edge regions is less than about 0.62 or greater than about 0.73. The plurality of acoustic wave devices having the same or substantially the same configuration as the first preferred embodiment have different duty ratios and different IDT electrode wavelengths from one another. Similarly, the plurality of acoustic wave devices of the second comparative example have different duty ratios and different IDT electrode wavelengths from one another. The acoustic velocities V2 in the edge regions of the acoustic wave devices were investigated.

The design parameters of the plurality of acoustic wave devices are summarized below. λ represents a wavelength defined by the electrode finger pitch of the IDT electrode. The electrode finger pitch is the distance between the electrode finger centers of adjacent first and second electrode fingers.

Support substrate: Material . . . Si

High-acoustic-velocity film: Material . . . SiN, Film thickness . . . about 900 nm Low-acoustic-velocity film: Material . . . $SiO_2$, Film thickness . . . about 600 nm Piezoelectric layer: Material . . . 50 Y-cut X-propagation $LiTaO_3$, Film thickness . . . about 600 nm IDT electrode: Materials . . . Ti/AlCu/Ti from piezoelectric substrate side, Film thicknesses of layers . . . about 12 nm/about 100 nm/about 4 nm from piezoelectric substrate side Duty ratios: Central region . . . about 0.45, Edge regions . . . Varied within range of about 0.45 to about 0.9

Wavelength λ of IDT electrode: about 1.5 μm, about 2 μm, or about 2.5 μm

Protective film: Material . . . SiO₂, Film thickness . . . about 35 nm

Figure 4:
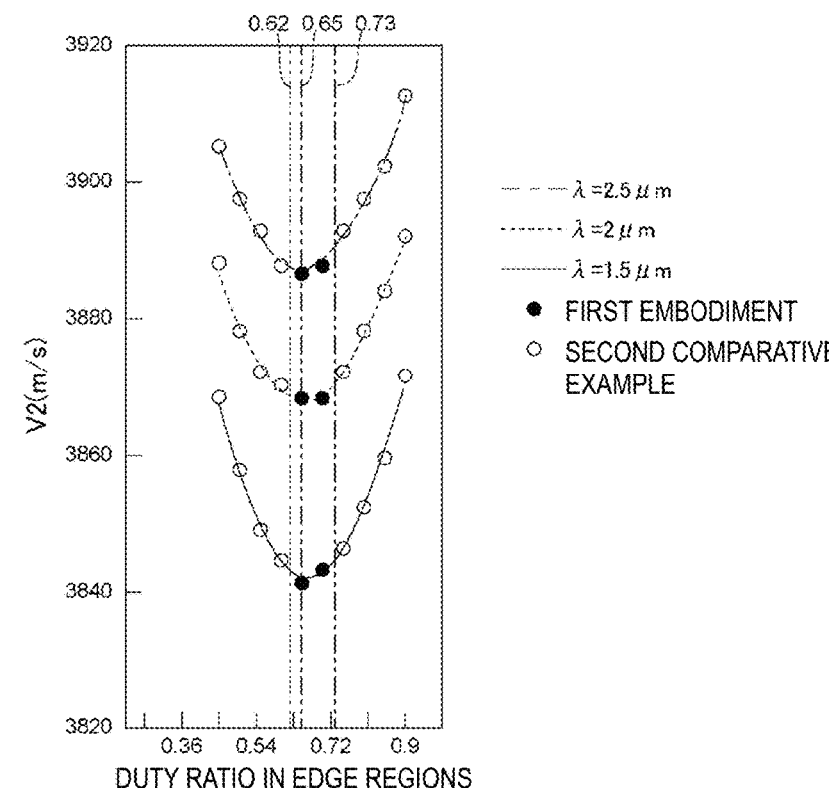
FIG. 4 is a diagram illustrating a relationship between the duty ratio in edge regions of an IDT electrode and an acoustic velocity V2 in an edge region for the first preferred embodiment of the present invention and a second comparative example.

FIG. 4 is a diagram illustrating the relationship between the duty ratio in edge regions of an IDT electrode and an acoustic velocity V2 in the edge regions for the first preferred embodiment and the second comparative example.

As illustrated in FIG. 4, when the wavelength λ is about 2.5 μm, the acoustic velocity V2 is lowest when the duty ratio in the edge regions is about 0.65. When the duty ratio is around about 0.65 or less, the acoustic velocity V2 decreases as the duty ratio increases. On the other hand, when the duty ratio is about 0.65 or more, the acoustic velocity increases as the duty ratio increases. The same trends are also observed when the wavelength λ is about 1.5 μm or about 2 μm. Thus, when the piezoelectric substrate has a multilayer structure as illustrated in FIG. 1, the acoustic velocity will become high if the duty ratio is too large. In the first preferred embodiment, the duty ratio in the edge regions is from about 0.62 to about 0.73, for example. It is clear that the acoustic velocity in the edge regions is particularly low in this range.

The strength of a ripple caused by a transverse mode in the acoustic wave devices was investigated. The wavelength λ was about 2 μm and the number of pairs of electrode fingers of the IDT electrode was 100. A dimension of the intersecting region in the second direction was termed an intersecting width, and the intersecting width was about 10λ. The rest of the design parameters is the same or substantially the same as described above.

Figure 5:
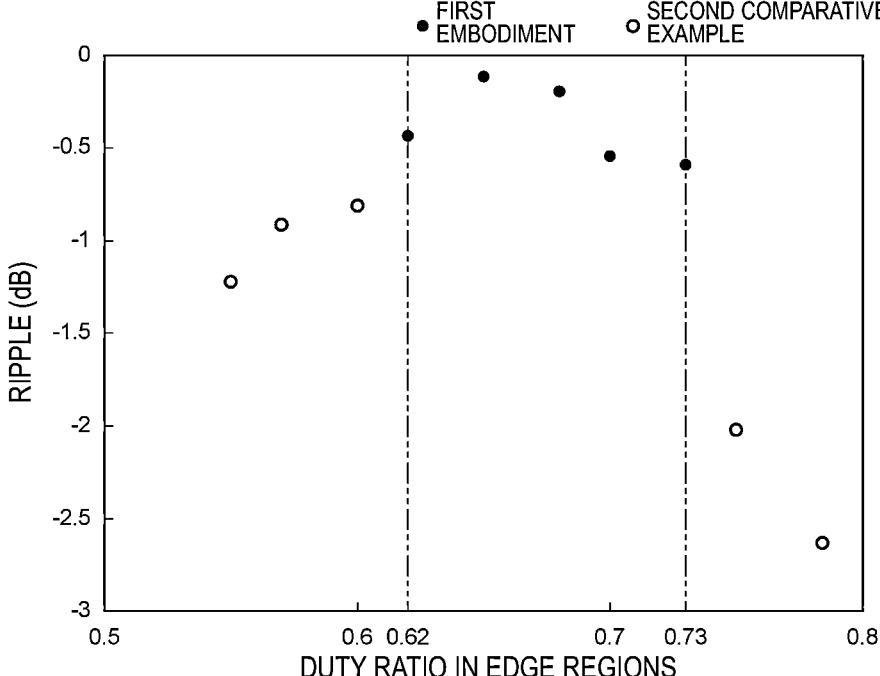
FIG. 5 is a diagram illustrating a relationship between the duty ratio in edge regions of an IDT electrode and the strength of a ripple due to a transverse mode for the first preferred embodiment of the present invention and the second comparative example.

FIG. 5 is a diagram illustrating the relationship between the duty ratio in edge regions of the IDT electrode and the strength of a ripple caused by a transverse mode for the first preferred embodiment and the second comparative example.

As illustrated in FIG. 5, the ripple can be more greatly reduced or prevented in the first preferred embodiment than in the second comparative example. As described above, the acoustic velocity in the edge regions can be more reliably and effectively reduced in the first preferred embodiment. Therefore, a piston mode can be more reliably established. Therefore, in the first preferred embodiment, a transverse mode can be more reliably and effectively reduced or prevented.

Furthermore, the relationship between the length of the edge regions of the IDT electrode and the strength of a ripple caused by a transverse mode in an acoustic wave device having the configuration of the first preferred embodiment was investigated. The length of the edge regions refers to the dimension of the edge regions along the second direction y. The duty ratio in the edge regions was about 0.65.

Figure 6:
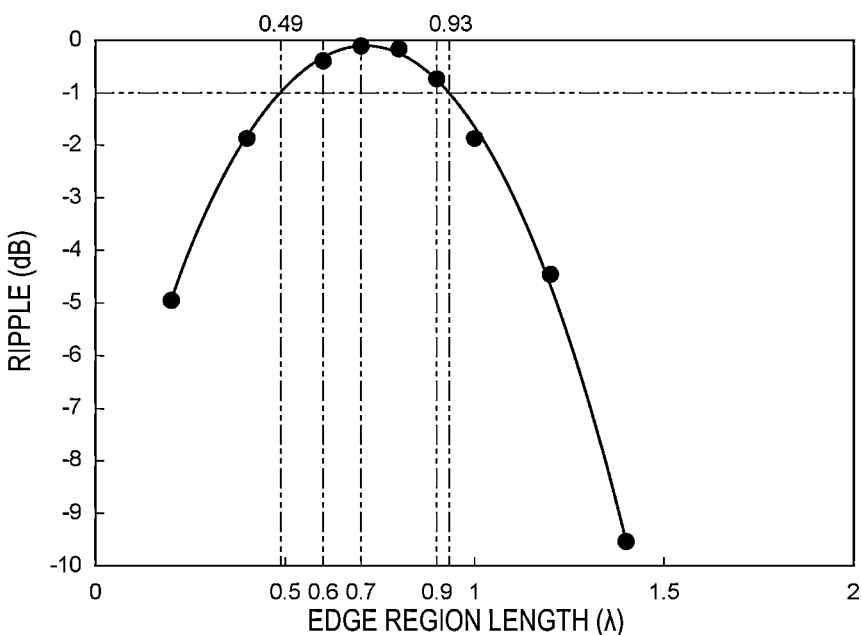
FIG. 6 is a diagram illustrating a relationship between an edge region length and the strength of a ripple caused by a transverse mode in a case where the duty ratio is about 0.65 in an edge region in the first preferred embodiment of the present invention.

FIG. 6 is a diagram illustrating the relationship between the length of the edge regions and the strength of a ripple caused by a transverse mode when the duty ratio in the edge regions is about 0.65 in the first preferred embodiment.

As illustrated in FIG. 6, it is clear that the absolute value of the strength of a ripple caused by a transverse mode has a minimum value when the length of the edge regions was about 0.7λ. The length of the edge regions is preferably from about 0.49λ to about 0.93λ, for example. In this case, the absolute value of the strength of a ripple caused by a transverse mode can be made less than or equal to about 1 dB and a transverse mode can be further reduced or prevented. The length of the edge regions is more preferably from about 0.6λ to about 0.9λ, for example. In this case, a transverse mode can be even more effectively reduced or prevented.

As described above, in the first preferred embodiment, the piezoelectric layer 16 is, for example, a lithium tantalate layer and the main electrode layer of the IDT electrode 3 is, for example, an AlCu layer. The film thickness of the Ti layer on the side of the piezoelectric layer 16 is, for example, about 12 nm and the film thickness of the Ti layer on the main electrode layer is, for example, about 4 nm, and the film thickness of the main electrode layer is varied. The Cu content percentage of the main electrode layer is, for example, less than or equal to about 2 wt %. The film thickness of the piezoelectric layer 16 is referred to as an LT film thickness and the film thickness of the first electrode fingers 6 and the second electrode fingers 7 is referred to as an electrode film thickness. The LT film thickness and the electrode film thickness are wavelength-normalized film thicknesses normalized using the wavelength λ. In addition, an optimum duty ratio is the duty ratio in the first edge region C₁ and the second edge region C₂ at which the acoustic velocity in the first edge region C₁ and the second edge region C₂ is lowest. In this case, the LT film thickness and the electrode film thickness preferably is, for example, in ranges where the optimum duty ratio is from about 0.62 to about 0.73 in Formula 1 below. As a result, a transverse mode can be more reliably reduced or prevented. This will be explained below.

$$
\begin{aligned}
\text{OPTIMUM DUTY RATIO} = {} & 0.66831566544375 + \\
& 0.821829726029454 \times ((\text{"ELECTRODE FILM} \\
& \text{THICKNESS } [\lambda]\text{"}) - 0.0625000000000001) + \\
& 0.0377723825227273 \times ((\text{"LT FILM THICKNESS } [\lambda]\text{"}) - \\
& 0.275) + 5.41169053151292 \times (((\text{"ELECTRODE} \\
& \text{FILM THICKNESS } [\lambda]\text{"}) - 0.0625000000000001) \times \\
& ((\text{"ELECTRODE FILM THICKNESS } [\lambda]\text{"}) - \\
& 0.0625000000000001) - 0.00053125) + \\
& (-0.325118002174692) \times (((\text{"ELECTRODE FILM} \\
& \text{THICKNESS } [\lambda]\text{"}) - 0.0625000000000001) \times \\
& ((\text{"LT FILM THICKNESS } [\lambda]\text{"}) - 0.275)) + \\
& (-0.0722908233901528) \times \\
& (((\text{"LT FILM THICKNESS } [\lambda]\text{"}) - \\
& 0.275) \times \\
& ((\text{"LT FILM THICKNESS } [\lambda]\text{"}) - \\
& 0.275) - \\
& 0.020625)
\end{aligned}
$$

FORMULA 1

When the relationship between the duty ratio in the edge regions and the acoustic velocity V2 was obtained as illustrated in FIG. 4, the film thickness of the main electrode layer of the IDT electrode 3 was about 100 nm and the film thickness of the piezoelectric layer 16 was about 600 nm as described above. When the wavelength λ is about 2.5 μm, the LT film thickness is about 0.24λ and the electrode film thickness is about 0.04λ ("LT film thickness [λ]"=about 0.24 and "electrode film thickness [λ]"=about 0.04 are substituted into Formula 1). At this time, as described above, the acoustic velocity V2 is lowest when the duty ratio in the edge regions is about 0.65. In this case, a transverse mode can be effectively reduced or prevented. Therefore, when the LT film thickness is about 0.24λ and the electrode film thickness is about 0.04λ, the optimum duty ratio in the edge regions is about 0.65. The relationship between the optimum duty ratio, the LT film thickness, and the electrode film thickness was obtained.

Figure 7:
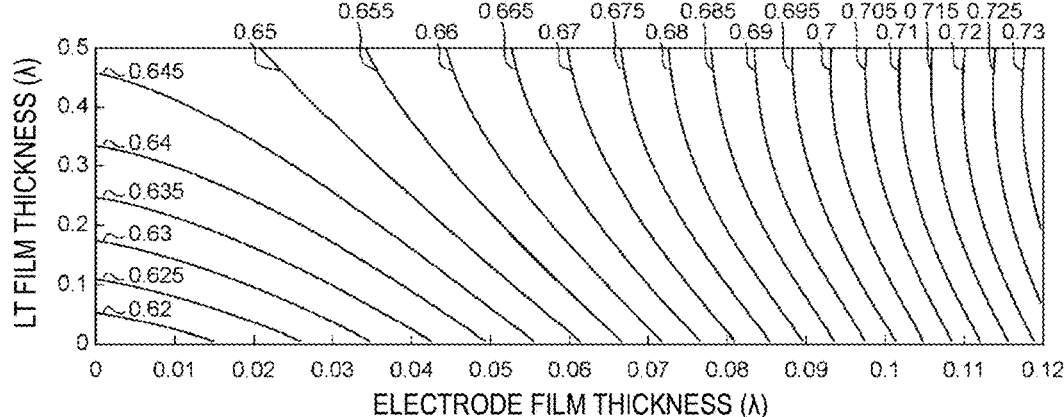
FIG. 7 is a diagram illustrating a relationship between an LT film thickness, an electrode film thickness, and an optimum duty ratio in an edge region of an IDT electrode.

FIG. 7 is a diagram illustrating the relationship between LT film thickness, electrode film thickness, and optimum duty ratio in the edge regions of an IDT electrode.

In FIG. 7, for example, the curved line labeled 0.62 represents the relationship between the LT film thickness and the electrode film thickness when the optimum duty ratio in the edge regions of the IDT electrode 3 is about 0.62. Similarly, in FIG. 7, the relationship between the LT film thickness and the electrode film thickness is illustrated for each value of optimum duty ratio from about 0.62 to about 0.73 in increments of about 0.005. Formula 1 above satisfies all of these relationships. Therefore, a transverse mode can be more reliably reduced or prevented when the LT film thickness and the electrode film thickness are in ranges where the optimum duty ratio is from about 0.62 to about 0.73 in Formula 1.

The main electrode layer of the IDT electrode 3 may be, for example, an Al layer. In this case, the content percentage of Cu in the main electrode layer is, for example, about 0 wt %. In the case where the main electrode layer is an Al layer as well, a transverse mode can be more reliably reduced or prevented when the LT film thickness and the electrode film thickness are in ranges where the optimum duty ratio is from about 0.62 to about 0.73 in Formula 1. Note that the IDT electrode 3 may include, for example, an adhesive layer or the like as in the first preferred embodiment as long as the above-described advantageous effects are not adversely impacted.

As described above, the IDT electrode 3 is not restricted to a multilayer metal film including a Ti layer, an AlCu layer, and a Ti layer. Hereafter, first to fourth modifications in which the configuration of the materials used in the IDT electrode differs from that in the first preferred embodiment will be described. In the first to fourth modifications as well, the Q value can be increased and a transverse mode can be more reliably reduced or prevented similarly to as in the first preferred embodiment.

In the first modification, the IDT electrode includes, for example, a Cu layer. In this modification, the Cu layer defines the main electrode layer of the IDT electrode. The film thickness of the Cu layer is referred to as a Cu film thickness. Similarly to as in the first preferred embodiment, the relationship between the optimum duty ratio, the LT film thickness, and the Cu film thickness was obtained. The LT film thickness and the Cu film thickness are preferably in ranges where the optimum duty ratio is from about 0.62 to about 0.73 in Formula 2 below. As a result, a transverse mode can be more reliably reduced or prevented. Note that the IDT electrode may include, for example, an adhesive layer or the like as long as the above-described advantageous effects are not adversely impacted.

$$\text{OPTIMUM DUTY RATIO} = 0.722361035255556 + \qquad \text{FORMULA 2}$$
$$0.0561123231333331 \times ((\text{``}LT \text{ FILM THICKNESS } [\lambda]\text{''}) -$$
$$0.3) + 0.450142117104374 \times ((\text{``}Cu \text{ FILM}$$

-continued
$$\text{THICKNESS } [\lambda]\text{''}) - 0.055) + (-0.189939099134199) \times$$
$$(((\text{``}LT \text{ FILM THICKNESS } [\lambda]\text{''}) - 0.3) \times$$
$$((\text{``}LT \text{ FILM THICKNESS } [\lambda]\text{''}) - 0.3) -$$
$$0.0166666666666667) + 0.0947647208080766 \times$$
$$((\text{``}LT \text{ FILM THICKNESS } [\lambda]\text{''}) - 0.3) \times$$
$$((\text{``}Cu \text{ FILM THICKNESS } [\lambda]\text{''}) - 0.055) +$$
$$5.94554881734021 \times$$
$$(((\text{``}Cu \text{ FILM THICKNESS } [\lambda]\text{''}) -$$
$$0.055) \times$$
$$((\text{``}Cu \text{ FILM THICKNESS } [\lambda]\text{''}) -$$
$$0.055) -$$
$$0.000824999999999999)$$

In the second modification, the IDT electrode includes, for example, a Pt layer and an Al layer. The Pt layer is directly stacked on the piezoelectric layer. The Al layer is directly stacked on the Pt layer. In this modification, the Pt layer defines the main electrode layer of the IDT electrode. The Al layer is an electrically conductive auxiliary layer. In the present specification, "electrically conductive auxiliary layer" refers to a layer having lower electrical resistance than the main electrode layer. The film thickness of the Pt is referred to as a Pt film thickness and the film thickness of the Al layer is referred to as an Al film thickness. Similarly to the first preferred embodiment, the relationship between the optimum duty ratio, the LT film thickness, the Pt film thickness, and the Al film thickness was obtained. The LT film thickness, the Pt film thickness, and the Al film thickness are preferably in ranges where the optimum duty ratio is from about 0.62 to about 0.73 in Formula 3 below. As a result, a transverse mode can be more reliably reduced or prevented.

$$\text{OPTIMUM DUTY RATIO} = \qquad \text{FORMULA 3}$$
$$0.706311420324445 + 0.0515443705199995 \times$$
$$((\text{``}LT \text{ FILM THICKNESS } [\lambda]\text{''}) - 0.3) +$$
$$0.340692430577689 \times ((A1 \text{ FILM THICKNESS } [\lambda]\text{''}) -$$
$$0.0750000000000001) + 1.92242704222223 \times ((\text{``}Pt \text{ FILM}$$
$$\text{THICKNESS } [\lambda]\text{''}) - 0.0125) + (-0.1623038581645) \times$$
$$(((\text{``}LT \text{ FILM THICKNESS } [\lambda]\text{''}) - 0.3) \times ((\text{``}LT$$
$$\text{FILM THICKNESS } [\lambda]\text{''}) - 0.3) - 0.0166666666666667) +$$
$$0.0686507973333415 \times ((\text{``}LT \text{ FILM THICKNESS } [\lambda]\text{''}) -$$
$$0.3) \times ((\text{``}A1 \text{ FILM THICKNESS } [\lambda]\text{''}) -$$
$$0.0750000000000001) + 5.08720585142787 \times$$
$$(((\text{``}A1 \text{ FILM THICKNESS } [\lambda]\text{''}) - 0.0750000000000001) \times$$
$$((\text{``}A1 \text{ FILM THICKNESS } [\lambda]\text{''}) -$$
$$0.0750000000000001) - 0.0003125) +$$
$$0.292474862666682 \times ((\text{``}LT \text{ FILM THICKNESS } [\lambda]\text{''}) -$$
$$0.3) \times$$

-continued $$((\text{``}Pt \text{ FILM THICKNESS } [\lambda]\text{''}) - 0.0125) +$$

$$(-22.1884852444445) \times ((\text{``}A1 \text{ FILM}$$

$$\text{THICKNESS } [\lambda]\text{''}) -$$

$$0.0750000000000001) \times ((\text{``}$$

$$Pt$$

$$\text{FILM}$$

$$\text{THICKNESS } [\lambda]\text{''}) -$$

$$0.0125) + -63.3669675555578 \times$$

$$(((\text{``}$$

$$Pt$$

$$\text{FILM}$$

$$\text{THICKNESS } [\lambda]\text{''}) -$$

$$0.0125) \times ((\text{``}Pt$$

$$\text{FILM}$$

$$\text{THICKNESS } [\lambda]\text{''} -$$

$$0.0125) - 0.00005)$$

The IDT electrode may include, for example, an adhesive layer or the like as long as the above-described advantageous effects are not adversely impacted. For example, the Pt layer may be indirectly stacked on the piezoelectric layer with an adhesive layer interposed therebetween. The Al layer may be indirectly stacked on the Pt layer with a diffusion preventing layer interposed therebetween.

In the third modification, the IDT electrode includes, for example, a W layer and an Al layer. The W layer is directly stacked on the piezoelectric layer. The Al layer is directly stacked on the W layer. In this modification, the W layer defines the main electrode layer of the IDT electrode. The Al layer is an electrically conductive auxiliary layer. The film thickness of the W is referred to as a W film thickness and the film thickness of the Al layer is referred to as an Al film thickness. Similarly to the first preferred embodiment, the relationship between the optimum duty ratio, the LT film thickness, the W film thickness, and the Al film thickness was obtained. The LT film thickness, the W film thickness, and the Al film thickness are preferably in ranges where the optimum duty ratio is from about 0.62 to about 0.73 in Formula 4 below. As a result, a transverse mode can be more reliably reduced or prevented. Similarly to the second modification, the IDT electrode may include, for example, an adhesive layer, a diffusion preventing layer, and so forth, as long as the above-described advantageous effects are not adversely impacted.

$$\text{OPTIMUM DUTY RATIO} = 0.670366655408889 + \quad \text{FORMULA 4}$$

$$0.0569799749733328 \times ((\text{``}LT \text{ FILM THICKNESS } [\lambda]\text{''}) -$$

$$0.3) + 0.601791697955469 \times ((\text{``}A1 \text{ FILM}$$

$$\text{THICKNESS } [\lambda]\text{''} - 0.0750000000000001) +$$

$$0.0898163408888796 \times ((\text{``}W \text{ FILM THICKNESS } [\lambda]\text{''}) -$$

$$0.0125) + (-0.186654102147184) \times$$

-continued $$(((\text{``}LT \text{ FILM THICKNESS } [\lambda]\text{''}) - 0.3) \times ((\text{``}LT \text{ FILM}$$

$$\text{THICKNESS } [\lambda]\text{''}) - 0.3) - 0.0166666666666667) +$$

$$0.00960756266667166 \times ((\text{``}LT \text{ FILM THICKNESS } [\lambda]\text{''}) -$$

$$0.3) \times ((\text{``}A1 \text{ FILM THICKNESS } [\lambda]\text{''}) -$$

$$0.0750000000000001) + 4.24356009650733 \times$$

$$(((\text{``}A1 \text{ FILM THICKNESS } [\lambda]\text{''}) - 0.0750000000000001) \times$$

$$((\text{``}A1 \text{ FILM THICKNESS } [\lambda]\text{''}) -$$

$$0.0750000000000001) - 0.0003125) +$$

$$0.54235624266667 \times ((\text{``}LT \text{ FILM THICKNESS } [\lambda]\text{''}) -$$

$$0.3) \times$$

$$((\text{``}W \text{ FILM THICKNESS } [\lambda]\text{''}) -$$

$$0.0125) + (-19.6658167822222) \times$$

$$((A1 \text{ FILM THICKNESS } [\lambda]\text{''}) -$$

$$0.0750000000000001) \times$$

$$((\text{``}W \text{ FILM THICKNESS } [\lambda]\text{''}) -$$

$$0.0125) +$$

$$15.4875977777752 \times$$

$$(((\text{``}W \text{ FILM}$$

$$\text{THICKNESS } [\lambda]\text{''}) - 0.0125) \times$$

$$((\text{``}W \text{ FILM THICKNESS } [\lambda]\text{''}) -$$

$$0.0125) -$$

$$0.00005)$$

In the fourth modification, the IDT electrode includes, for example, a Mo layer and an Al layer. The Mo layer is directly stacked on the piezoelectric layer. The Al layer is directly stacked on the Mo layer. In this modification, the Mo layer defines the main electrode layer of the IDT electrode. The Al layer is an electrically conductive auxiliary layer. The film thickness of the Mo is referred to as a Mo film thickness and the film thickness of the Al layer is referred to as an Al film thickness. Similarly to the first preferred embodiment, the relationship between the optimum duty ratio, the LT film thickness, the Mo film thickness, and the Al film thickness was obtained. The LT film thickness, the Mo film thickness, and the Al film thickness are preferably in ranges where the optimum duty ratio is from about 0.62 to about 0.73 in Formula 5 below. As a result, a transverse mode can be more reliably reduced or prevented. Similarly to the second modification, the IDT electrode may include, for example, an adhesive layer, a diffusion preventing layer, and so forth as long as the above-described advantageous effects are not adversely impacted. The Cu film thickness, the Pt film thickness, the Al film thickness, the W film thickness, and the Mo film thickness in Formulas 2 to 5 are more specifically film thicknesses of the first electrode fingers 6 and the second electrode fingers 7.

$$\text{OPTIMUM DUTY RATIO} = 0.650578355337778 + \quad \text{FORMULA 5}$$

$$0.0565759044933328 \times ((\text{``}LT \text{ FILM THICKNESS } [\lambda]\text{''}) -$$

$$0.3) + 0.896476823999908 \times ((\text{``}A1 \text{ FILM}$$

-continued

THICKNESS [λ]″) − 0.0750000000000001) +

(−0.835424887999999) × ((“Mo FILM

THICKNESS [λ]″) − 0.0125) + (−0.182142102839825) ×

(((“LT FILM THICKNESS [λ]″) − 0.3) × ((“LT

FILM THICKNESS [λ]″) − 0.3) −

0.0166666666666667) + (−0.0337296554666596) ×

((“LT FILM THICKNESS [λ]″) − 0.3) × ((“Al

FILM THICKNESS [λ]″) − 0.0750000000000001) +

3.10610546793597 × (((“Al FILM THICKNESS [λ]″) −

0.0750000000000001) × ((“Al FILM

THICKNESS [λ]″) − 0.0750000000000001) −

0.0003125) + 0.286014725333341 × ((“LT FILM

THICKNESS [λ]″) − 0.3) ×

((“Mo FILM THICKNESS [λ]″) − 0.0125) +

(−8.1523516622225) × ((“Al FILM

THICKNESS [λ]″) −

0.0750000000000001) × ((“

Mo

FILM

THICKNESS [λ]″) −

0.0125) + 63.3934203174576 ×

(((“Mo FILM

THICKNESS [λ]″) − 0.0125) ×

((“Mo FILM THICKNESS [λ]″) − 0.0125) −

0.00005)

Figure 8:
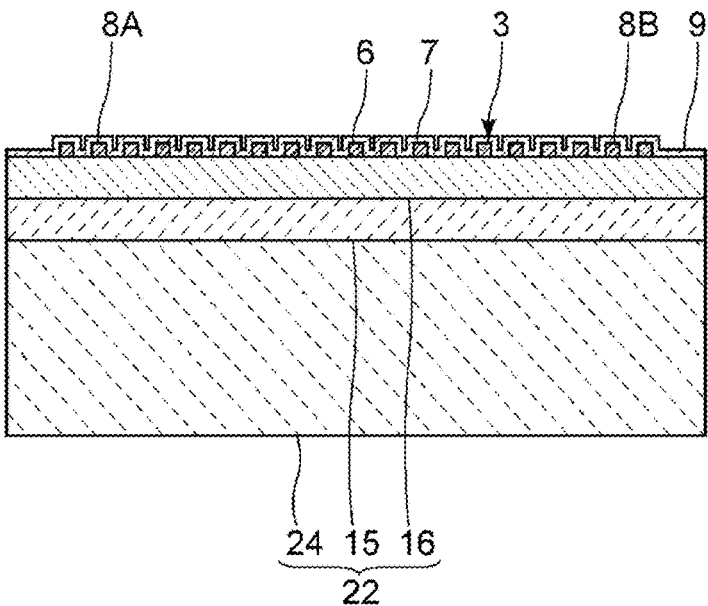
FIG. 8 is a schematic elevational cross-sectional view of an acoustic wave device according to a fifth modification of the first preferred embodiment of the present invention.

FIG. 8 is a schematic elevational cross-sectional view of an acoustic wave device according to a fifth modification of the first preferred embodiment of the present invention.

In this modification, the high-acoustic-velocity material layer is a high-acoustic-velocity support substrate 24. A piezoelectric substrate 22 is a multilayer substrate in which the high-acoustic-velocity support substrate 24, the low-acoustic-velocity film 15, and the piezoelectric layer 16 are stacked in order. In this case as well, similarly to the first preferred embodiment, the Q value can be increased and a transverse mode can be more reliably reduced or prevented.

For example, a medium mainly including any material of silicon, aluminum oxide, silicon carbide, silicon nitride, silicon oxynitride, sapphire, lithium tantalate, lithium niobate, quartz, alumina, zirconia, cordierite, mullite, steatite, forsterite, magnesia, a DLC film, and diamond can be used as the material for the high-acoustic-velocity support substrate 24.

Figure 9:
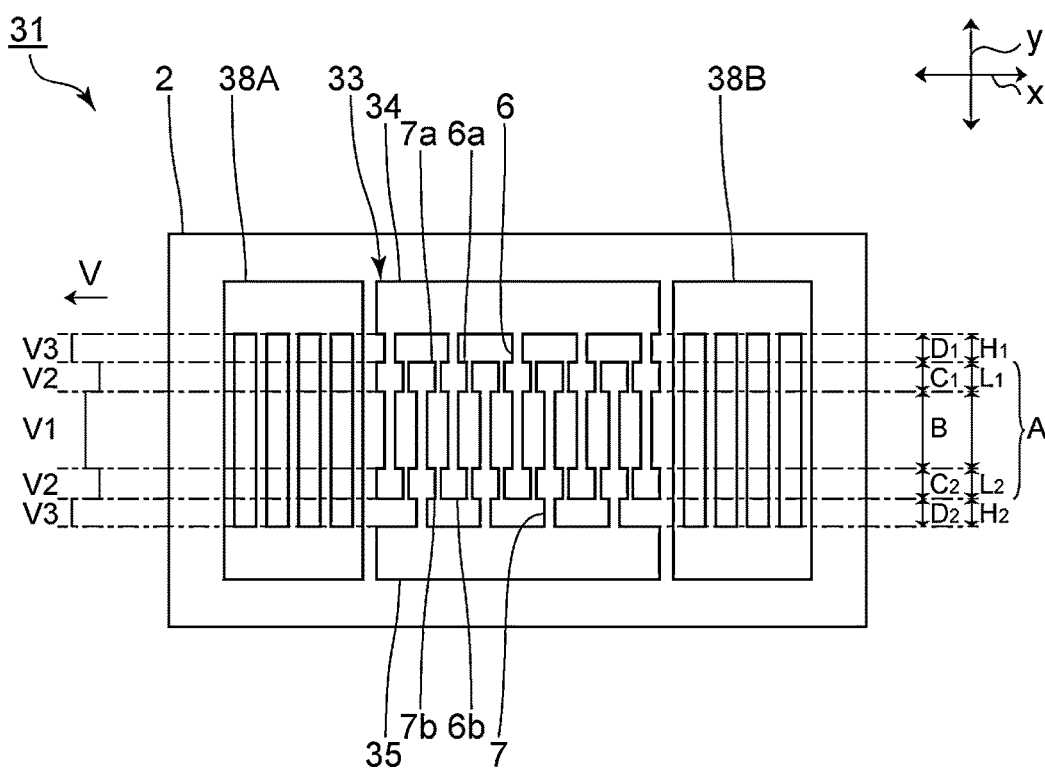
FIG. 9 is a schematic plan view of an acoustic wave device according to a second preferred embodiment of the present invention.

FIG. 9 is a schematic plan view of an acoustic wave device according to a second preferred embodiment of the present invention.

The present preferred embodiment differs from the first preferred embodiment in that a first busbar 34 and a second busbar 35 of an IDT electrode 33 do not include opening forming regions and in that a reflector 38A and a reflector 38B do not include first openings or second openings. In other respects, an acoustic wave device 31 of the present preferred embodiment has the same or substantially the same configuration as the first preferred embodiment.

In the present preferred embodiment, first electrode fingers 6 and second electrode fingers 7 of the IDT electrode 33 respectively include first wide portions 6a and first wide portions 7a and second wide portions 6b and second wide portions 7b in a first edge region $C_1$ and a second edge region $C_2$. The duty ratio is, for example, from about 0.62 to about 0.73 in the first edge region $C_1$ and the second edge region $C_2$. Consequently, the acoustic velocity in the low-acoustic-velocity regions can be more reliably lowered. Thus, a piston mode can be more reliably established and a transverse mode can be more reliably reduced or prevented.

In the first preferred embodiment and the modifications thereof and in the second preferred embodiment, first electrode fingers and the second electrode fingers include first wide portions and second wide portions. In this way, low-acoustic-velocity regions are provided. In addition, low-acoustic-velocity regions may be provided by including mass-adding films. Examples of this technique will be described in first to third modifications of the second preferred embodiment below. In the first to third modifications, a transverse mode can be more reliably reduced or prevented as in the second preferred embodiment.

Figure 10:
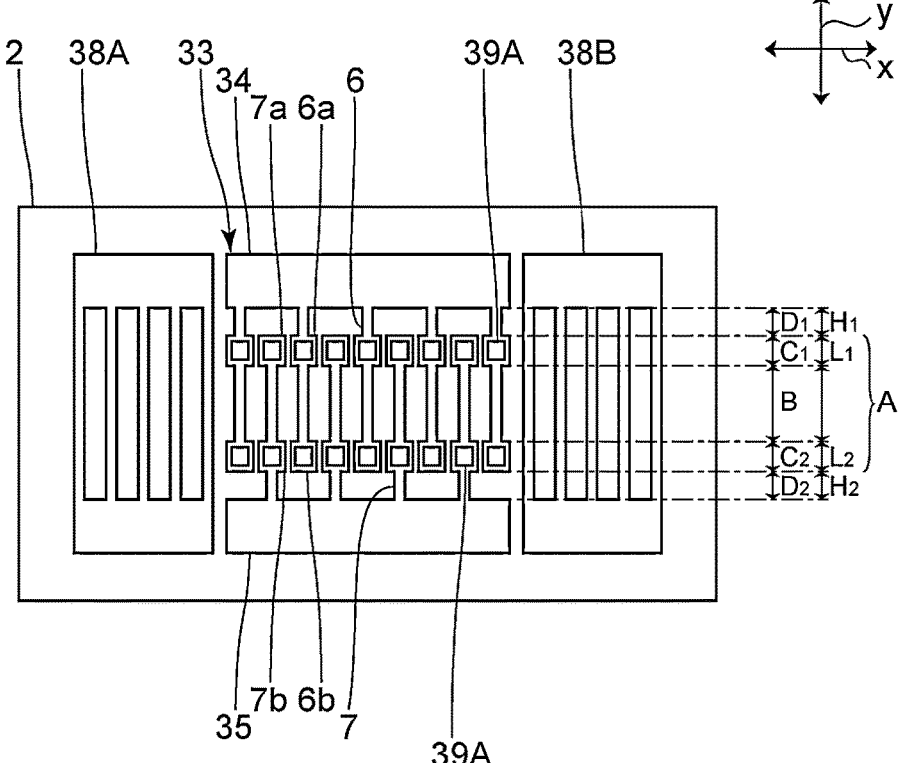
FIG. 10 is a schematic plan view of an acoustic wave device according to a first modification of the second preferred embodiment of the present invention.

In the first modification illustrated in FIG. 10, a plurality of mass-adding films 39A are provided on the plurality of first electrode fingers 6 and on the plurality of second electrode fingers 7 in the first edge region $C_1$. More specifically, the mass-adding films 39A are provided on each of the first electrode fingers 6 and on each of the second electrode fingers 7. Similarly, a plurality of mass-adding films 39A are provided on the plurality of first electrode fingers 6 and on the plurality of second electrode fingers 7 in the second edge region $C_2$. Metal films or dielectric films may be used as the mass-adding films 39A. For example, Pt, W, Au, or the like can be used as metal films and $Ta_2O_5$, $HfO_2$, $WO_3$, or the like can be used as dielectric films. Strip-shaped mass-adding films may be provided on the plurality of first electrode fingers 6 and on the plurality of second electrode fingers 7 in the first edge region $C_1$ and in the second edge region $C_2$. In this case, for example, dielectric films are used as the strip-shaped mass-adding films.

Figure 11:
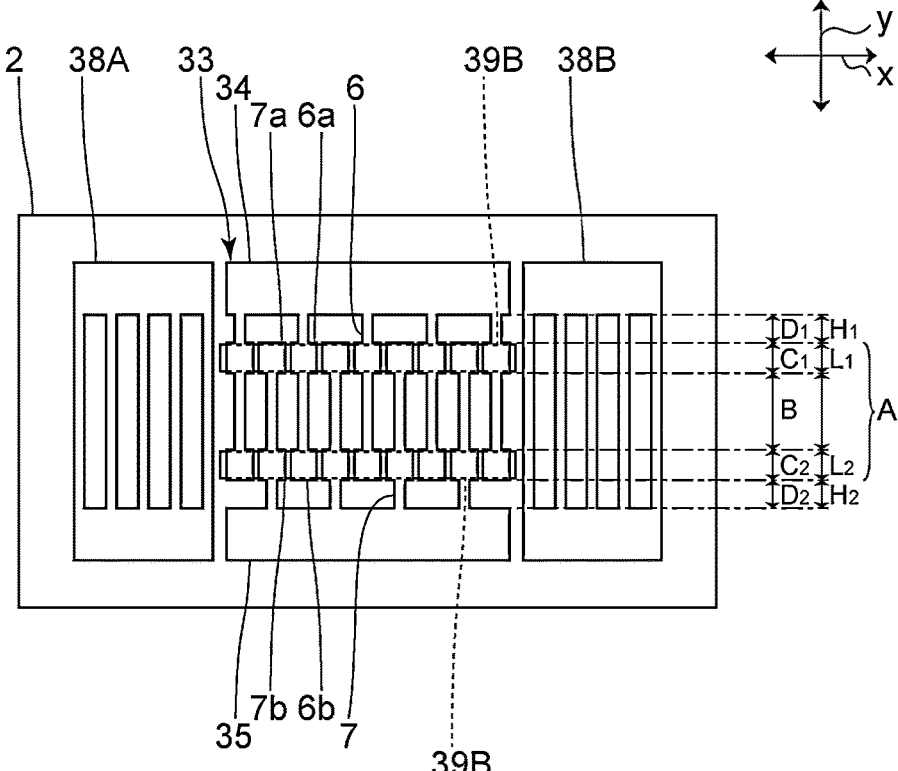
FIG. 11 is a schematic plan view of an acoustic wave device according to a second modification of the second preferred embodiment of the present invention.

In the second modification illustrated in FIG. 11, mass-adding films 39B are provided between the IDT electrode 33 and the piezoelectric substrate 2. More specifically, a strip-shaped mass-adding film 39B is provided between the first electrode fingers 6 and the second electrode fingers 7 and the piezoelectric layer 16 in the first edge region $C_1$. Similarly, a strip-shaped mass-adding film 39B is provided between the first electrode fingers 6 and the second electrode fingers 7 and the piezoelectric layer 16 in the second edge region $C_2$. The mass-adding films 39B also extend through portions of the first edge region $C_1$ and the second edge region $C_2$ where the first electrode fingers 6 and the second electrode fingers 7 are not located. Similarly as the case described above, dielectric films are used as the strip-shaped mass-adding films 39B. The plurality of mass-adding films 39A illustrated in FIG. 10 may be provided between the first electrode fingers 6 and the second electrode fingers 7 and the piezoelectric layer 16.

Figure 12:
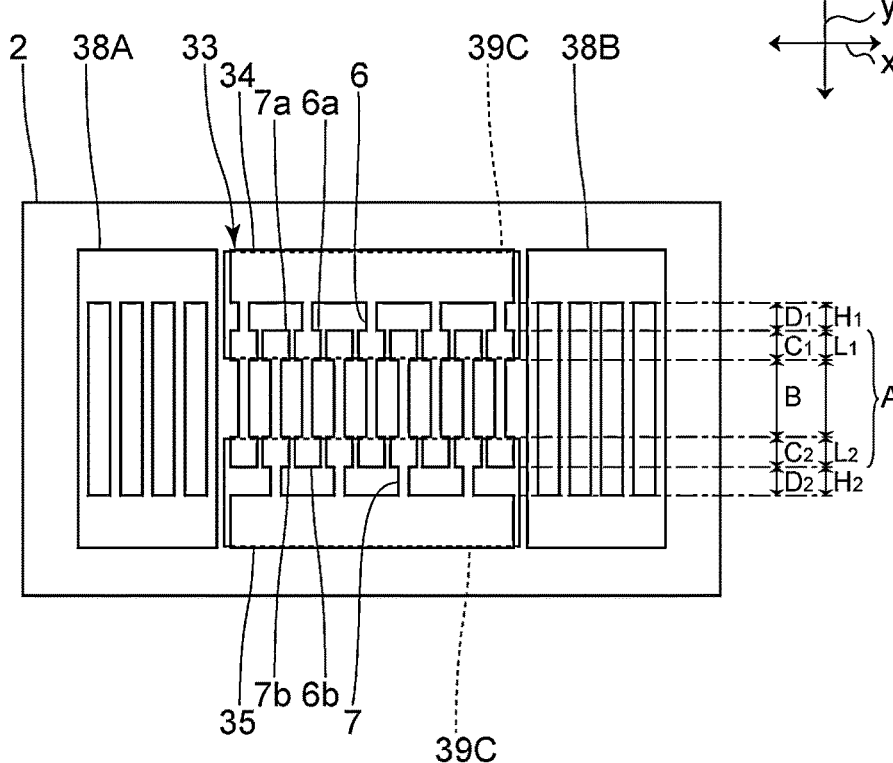
FIG. 12 is a schematic plan view of an acoustic wave device according to a third modification of the second preferred embodiment of the present invention.

In the third modification illustrated in FIG. 12, mass-adding films 39C are provided between the piezoelectric substrate 2 and portions of the IDT electrode 33 other than the portions of the IDT electrode 33 located in the central region B. More specifically, a mass-adding film 39C is provided between the plurality of first electrode fingers 6 and the plurality of second electrode fingers 7 and the piezoelectric layer 16 in the first edge region $C_1$ and the first gap region $D_1$. In addition, the mass-adding film 39C extends between the first busbar 34 and the piezoelectric layer 16. Similarly, a mass-adding film 39C is provided between the plurality of first electrode fingers 6 and the plurality of second electrode fingers 7 and the piezoelectric layer 16 in the second edge region $C_2$ and the second gap region $D_2$. In addition, the mass-adding film 39C extends between the second busbar 35 and the piezoelectric layer 16. The mass-adding films 39C are shaped like sheets and also extend through portions of the first edge region $C_1$ and the second gap region $D_2$ and the second edge region $C_2$ and the second gap region $D_2$ where the first electrode fingers 6 and the second electrode fingers 7 are not located.

While preferred embodiments of the present invention have been described above, it is to be understood that variations and modifications will be apparent to those skilled in the art without departing from the scope and spirit of the present invention. The scope of the present invention, therefore, is to be determined solely by the following claims.

What is claimed is:

1. An acoustic wave device comprising:
a high-acoustic-velocity material layer;
a low-acoustic-velocity film on the high-acoustic-velocity material layer;
a piezoelectric layer including lithium tantalate on the low-acoustic-velocity film; and
an interdigital transducer (IDT) electrode on the piezoelectric layer; wherein
an acoustic velocity of bulk waves propagating through the high-acoustic-velocity material layer is higher than an acoustic velocity of acoustic waves propagating through the piezoelectric layer;
an acoustic velocity of bulk waves propagating through the low-acoustic-velocity film is lower than an acoustic velocity of bulk waves propagating through the piezoelectric layer;
the IDT electrode includes a first busbar and a second busbar facing each other, a plurality of first electrode fingers each including one end connected to the first busbar, and a plurality of second electrode fingers each including one end connected to the second busbar and electrode where the first electrode fingers and the second electrode fingers overlap in the first direction is an intersecting region;
the intersecting region includes a central region centrally located in the second direction, a first edge region at a side of the central region closer to the first busbar, and a second edge region at a side of the central region closer to the second busbar;
the IDT electrode includes a first gap region between the first edge region and the first busbar and a second gap region between the second edge region and the second busbar;
the first electrode fingers and the second electrode fingers are wider in at least one region of the first edge region and the second edge region than in the central region; and
a duty ratio in the first edge region and the second edge region is from 0.62 to 0.73.

2. The acoustic wave device according to claim 1, wherein
a low-acoustic-velocity region having a lower acoustic velocity than the central region is in the first edge region and the second edge region; and
a high-acoustic-velocity region having a higher acoustic velocity than the central region is outside the first edge region in the second direction and outside the second edge region in the second direction.

3. The acoustic wave device according to claim 2, wherein the high- acoustic-velocity region is in the first gap region and the second gap region.

4. The acoustic wave device according to claim 1, wherein
the IDT electrode includes a main electrode layer;
the main electrode layer is an Al layer or an AlCu layer;
a Cu content percentage of the main electrode layer is less than or equal to 2 wt %; and
when an optimum duty ratio is a duty ratio in the first edge region and the second edge region at which an acoustic velocity in the first edge region and the second edge region is lowest, an LT film thickness is a film thickness of the piezoelectric layer, and an electrode film thickness is a film thickness of the main electrode layer in the first electrode fingers and the second electrode fingers of the IDT electrode, the LT film thickness and the electrode film thickness are within ranges where the optimum duty ratio is from 0.62 to 0.73 in Formula 1 below:

$$\text{OPTIMUM DUTY RATIO} = 0.66831566544375 \qquad \text{FORMULA 1}$$

$$+0.821829726029454 \times ((\text{"ELECTRODE FILM THICKNESS } [\lambda]\text{"}) - 0.0625000000000001)$$

$$+0.0377723825227273 \times ((\text{"LT FILM THICKNESS } [\lambda]\text{"}) - 0.275)$$

$$+5.41169053151292 \times (((\text{"ELECTRODE FILM THICKNESS } [\lambda]\text{"}) - 0.0625000000000001)$$

$$\times ((\text{"ELECTRODE FILM THICKNESS } [\lambda]\text{"}) - 0.0625000000000001) - 0.00053125)$$

$$+(-0.325118002174692) \times (((\text{"ELECTRODE FILM THICKNESS } [\lambda]\text{"}) - 0.0625000000000001)$$

$$\times ((\text{"LT FILM THICKNESS } [\lambda]\text{"}) - 0.275))$$

$$+(-0.0722908233901528) \times (((\text{"LT FILM THICKNESS } [\lambda]\text{"}) - 0.275))$$

$$\times ((\text{"LT FILM THICKNESS } [\lambda]\text{"}) - 0.275) - 0.020625).$$

that are interdigitated with the plurality of first electrode fingers;
when an acoustic wave propagation direction is a first direction and a direction perpendicular to the first direction is a second direction, a portion of the IDT 5. The acoustic wave device according to claim 1, wherein
the IDT electrode includes a Cu layer; and
when an optimum duty ratio is a duty ratio in the first edge region and the second edge region at which an acoustic velocity in the first edge region and the second edge region is lowest, an LT film thickness is a film thickness of the piezoelectric layer, and a Cu film thickness is a film thickness of the Cu layer in the first electrode fingers and the second electrode fingers of the IDT electrode, the LT film thickness and the Cu film thickness are within ranges where the optimum duty ratio is from 0.62 to 0.73 in Formula 2 below:

$$\text{OPTIMUM DUTY RATIO} = 0.722361035255556 \qquad \text{FORMULA 2}$$

$$+0.0561123231333331 \times ((''\text{LT FILM THICKNESS } [\lambda]'') - 0.3)$$

$$+0.450142117104374 \times ((''\text{Cu FILM THICKNESS } [\lambda]'') - 0.055)$$

$$+(-0.189939099134199) \times (((''\text{LT FILM THICKNESS } [\lambda]'') - 0.3)$$

$$\times ((''\text{LT FILM THICKNESS } [\lambda]'') - 0.3) - 0.0166666666666667)$$

$$+0.0947647208080766 \times ((''\text{LT FILM THICKNESS } [\lambda]'') - 0.3)$$

$$\times ((''\text{Cu FILM THICKNESS } [\lambda]'') - 0.055)$$

$$+5.94554881734021 \times (((''\text{Cu FILM THICKNESS } [\lambda]'') - 0.055)$$

$$\times ((''\text{Cu FILM THICKNESS } [\lambda]'') - 0.055) - 0.000824999999999999).$$

6. The acoustic wave device according to claim 1, wherein the IDT electrode includes a Pt layer stacked on the piezoelectric layer and an Al layer stacked on the Pt layer; and when an optimum duty ratio is a duty ratio in the first edge region and the second edge region at which an acoustic velocity in the first edge region and the second edge region is lowest, an LT film thickness is a film thickness of the piezoelectric layer, and a Pt film thickness and an Al film thickness are respectively a film thickness of the Pt layer and a film thickness of the Al layer in the first electrode fingers and the second electrode fingers of the IDT electrode, the LT film thickness, the Pt film thickness, and the Al film thickness are in ranges where the optimum duty ratio is from 0.62 to 0.73 in Formula 3 below:

$$\text{OPTIMUM DUTY RATIO} = 0.706311420324445 \qquad \text{FORMULA 3}$$

$$+0.0515443705199995 \times ((''\text{LT FILM THICKNESS } [\lambda]'') - 0.3)$$

$$+0.340692430577689 \times ((''\text{Al FILM THICKNESS } [\lambda]'') - 0.0750000000000001)$$

$$+1.92242704222223 \times ((''\text{Pt FILM THICKNESS } [\lambda]'') - 0.0125)$$

$$+(-0.1623038581645) \times (((''\text{LT FILM THICKNESS } [\lambda]'') - 0.3)$$

$$\times ((''\text{LT FILM THICKNESS } [\lambda]'') - 0.3) - 0.0166666666666667)$$

$$+0.0686507973333415 \times ((''\text{LT FILM THICKNESS } [\lambda]'') - 0.3)$$

$$\times ((''\text{Al FILM THICKNESS } [\lambda]'') - 0.0750000000000001)$$

$$+5.08720585142787 \times (((''\text{Al FILM THICKNESS } [\lambda]'') - 0.0750000000000001)$$

$$\times ((''\text{Al FILM THICKNESS } [\lambda]'') - 0.0750000000000001) - 0.0003125)$$

$$+0.292474862666682 \times ((''\text{LT FILM THICKNESS } [\lambda]'') - 0.3)$$

$$\times ((''\text{Pt FILM THICKNESS } [\lambda]'') - 0.0125)$$

$$+(-22.1884852444445) \times ((''\text{Al FILM THICKNESS } [\lambda]'') - 0.0750000000000001)$$

$$\times ((''\text{Pt FILM THICKNESS } [\lambda]'') - 0.0125)$$

$$+-63.3669675555578 \times (((''\text{Pt FILM THICKNESS } [\lambda]'') - 0.0125)$$

$$\times ((''\text{Pt FILM THICKNESS } [\lambda]'') - 0.0125) - 0.00005).$$

7. The acoustic wave device according to claim 1, wherein the IDT electrode includes a W layer stacked on the piezoelectric layer and an Al layer stacked on the W layer; and when an optimum duty ratio is a duty ratio in the first edge region and the second edge region at which an acoustic velocity in the first edge region and the second edge region is lowest, an LT film thickness is a film thickness of the piezoelectric layer, and a W film thickness and an Al film thickness are respectively a film thickness of the W layer and a film thickness of the Al layer in the first electrode fingers and the second electrode fingers of the IDT electrode, the LT film thickness, the W film thickness, and the Al film thickness are in ranges where the optimum duty ratio is from 0.62 to 0.73 in Formula 4 below:

$$
\begin{aligned}
\text{OPTIMUM DUTY RATIO} = {} & 0.670366655408889 && \text{FORMULA 4}\\
& +0.0569799749733328 \times ((''\text{LT FILM THICKNESS } [\lambda]'') - 0.3)\\
& +0.601791697955469 \times ((''\text{Al FILM THICKNESS } [\lambda]'') - 0.0750000000000001)\\
& +0.0898163408888796 \times ((''\text{W FILM THICKNESS } [\lambda]'') - 0.0125)\\
& +(-0.186654102147184) \times (((''\text{LT FILM THICKNESS } [\lambda]'') - 0.3)\\
& \times ((''\text{LT FILM THICKNESS } [\lambda]'') - 0.3) - 0.0166666666666666667)\\
& +0.00960756266667166 \times ((''\text{LT FILM THICKNESS } [\lambda]'') - 0.3)\\
& \times ((''\text{Al FILM THICKNESS } [\lambda]'') - 0.0750000000000001)\\
& +4.24356009650733 \times (((''\text{Al FILM THICKNESS } [\lambda]'') - 0.0750000000000001)\\
& \times ((''\text{Al FILM THICKNESS } [\lambda]'') - 0.0750000000000001) - 0.0003125)\\
& +0.54235624266667 \times ((''\text{LT FILM THICKNESS } [\lambda]'') - 0.3)\\
& \times ((''\text{W FILM THICKNESS } [\lambda]'') - 0.0125)\\
& +(-19.6658167822222) \times ((''\text{Al FILM THICKNESS } [\lambda]'') - 0.0750000000000001)\\
& \times ((''\text{W FILM THICKNESS } [\lambda]'') - 0.0125)\\
& +15.4875977777752 \times (((''\text{W FILM THICKNESS } [\lambda]'') - 0.0125)\\
& \times ((''\text{W FILM THICKNESS } [\lambda]'') - 0.0125) - 0.00005).
\end{aligned}
$$

8. The acoustic wave device according to claim 1, wherein the IDT electrode includes a Mo layer stacked on the piezoelectric layer and an Al layer stacked on the Mo layer; and when an optimum duty ratio is a duty ratio in the first edge region and the second edge region at which an acoustic velocity in the first edge region and the second edge region is lowest, an LT film thickness is a film thickness of the piezoelectric layer, and a Mo film thickness and an Al film thickness are respectively a film thickness of the Mo layer and a film thickness of the Al layer in the first electrode fingers and the second electrode fingers of the IDT electrode, the LT film thickness, the Mo film thickness, and the Al film thickness are in ranges so that the optimum duty ratio is from 0.62 to 0.73 in Formula 5 below:

$$
\begin{aligned}
\text{OPTIMUM DUTY RATIO} = {} & 0.650578355337778 && \text{FORMULA 5}\\
& +0.0565759044933328 \times ((''\text{LT FILM THICKNESS } [\lambda]'') - 0.3)\\
& +0.896476823999908 \times ((''\text{Al FILM THICKNESS } [\lambda]'') - 0.0750000000000001)\\
& +(-0.835424887999999) \times ((''\text{Mo FILM THICKNESS } [\lambda]'') - 0.0125)\\
& +(-0.182142102839825) \times (((''\text{LT FILM THICKNESS } [\lambda]'') - 0.3)\\
& \times ((''\text{LT FILM THICKNESS } [\lambda]'') - 0.3) - 0.0166666666666666667)\\
& +(-0.0337296554666596) \times ((''\text{LT FILM THICKNESS } [\lambda]'') - 0.3)\\
& \times ((''\text{Al FILM THICKNESS } [\lambda]'') - 0.0750000000000001)
\end{aligned}
$$

-continued $+3.10610546793597 \times ((("Al\ FILM\ THICKNESS\ [\lambda]") - 0.0750000000000001)$ $\times (("Al\ FILM\ THICKNESS\ [\lambda]") - 0.0750000000000001) - 0.0003125)$ $+0.286014725333341 \times (("LT\ FILM\ THICKNESS\ [\lambda]") - 0.3)$ $\times (("Mo\ FILM\ THICKNESS\ [\lambda]") - 0.0125)$ $+(-8.1523516622225) \times (("Al\ FILM\ THICKNESS\ [\lambda]") - 0.0750000000000001)$ $\times (("Mo\ FILM\ THICKNESS\ [\lambda]") - 0.0125)$ $+63.3934203174576 \times ((("W\ FILM\ THICKNESS\ [\lambda]") - 0.0125)$ $\times (("Mo\ FILM\ THICKNESS\ [\lambda]") - 0.0125) - 0.00005).$

9. The acoustic wave device according to claim 1, wherein the high-acoustic-velocity material layer is a high-acoustic-velocity support substrate.

10. The acoustic wave device according to claim 1, further comprising:

a support substrate; wherein the high-acoustic-velocity material layer is a high-acoustic-velocity film provided on the support substrate.

11. The acoustic wave device according to claim 2, wherein the IDT electrode includes a main electrode layer;

the main electrode layer is an Al layer or an AlCu layer;

a Cu content percentage of the main electrode layer is less than or equal to 2 wt %; and when an optimum duty ratio is a duty ratio in the first edge region and the second edge region at which an acoustic velocity in the first edge region and the second edge region is lowest, an LT film thickness is a film thickness of the piezoelectric layer, and an electrode film thickness is a film thickness of the main electrode layer in the first electrode fingers and the second electrode fingers of the IDT electrode, the LT film thickness and the electrode film thickness are within ranges where the optimum duty ratio is from 0.62 to 0.73 in Formula 1 below:

$$OPTIMUM\ DUTY\ RATIO = 0.66831566544375 \qquad \text{FORMULA 1}$$

$+0.821829726029454 \times (("ELECTRODE\ FILM\ THICKNESS\ [\lambda]") - 0.0625000000000001)$ $+0.0377723825227273 \times (("LT\ FILM\ THICKNESS\ [\lambda]") - 0.275)$ $+5.41169053151292 \times ((("ELECTRODE\ FILM\ THICKNESS\ [\lambda]") - 0.0625000000000001)$ $\times (("ELECTRODE\ FILM\ THICKNESS\ [\lambda]") - 0.0625000000000001) - 0.00053125)$ $+(-0.325118002174692) \times ((("ELECTRODE\ FILM\ THICKNESS\ [\lambda]") - 0.0625000000000001)$ $\times (("LT\ FILM\ THICKNESS\ [\lambda]") - 0.275))$ $+(-0.0722908233901528) \times ((("LT\ FILM\ THICKNESS\ [\lambda]") - 0.275))$ $\times (("LT\ FILM\ THICKNESS\ [\lambda]") - 0.275) - 0.020625).$

12. The acoustic wave device according to claim 2, wherein the IDT electrode includes a Cu layer; and when an optimum duty ratio is a duty ratio in the first edge region and the second edge region at which an acoustic velocity in the first edge region and the second edge region is lowest, an LT film thickness is a film thickness of the piezoelectric layer, and a Cu film thickness is a film thickness of the Cu layer in the first electrode fingers and the second electrode fingers of the IDT electrode, the LT film thickness and the Cu film thickness are within ranges where the optimum duty ratio is from 0.62 to 0.73 in Formula 2 below:

$$OPTIMUM\ DUTY\ RATIO = 0.722361035255556 \qquad \text{FORMULA 2}$$

$+0.0561123231333331 \times (("LT\ FILM\ THICKNESS\ [\lambda]") - 0.3)$ $+0.450142117104374 \times (("Cu\ FILM\ THICKNESS\ [\lambda]") - 0.055)$ $+(-0.189939099134199) \times ((("LT\ FILM\ THICKNESS\ [\lambda]") - 0.3)$ -continued $\times (($"LT FILM THICKNESS $[\lambda]$"$) - 0.3) - 0.0166666666666667)$ $+0.0947647208080766 \times (($"LT FILM THICKNESS $[\lambda]$"$) - 0.3)$ $\times (($"Cu FILM THICKNESS $[\lambda]$"$) - 0.055)$ $+5.94554881734021 \times ((($"Cu FILM THICKNESS $[\lambda]$"$) - 0.055)$ $\times (($"Cu FILM THICKNESS $[\lambda]$"$) - 0.055) - 0.000824999999999999).$

13. The acoustic wave device according to claim 2, wherein the IDT electrode includes a Pt layer stacked on the piezoelectric layer and an Al layer stacked on the Pt layer; and when an optimum duty ratio is a duty ratio in the first edge region and the second edge region at which an acoustic velocity in the first edge region and the second edge region is lowest, an LT film thickness is a film thickness of the piezoelectric layer, and a Pt film thickness and an Al film thickness are respectively a film thickness of the Pt layer and a film thickness of the Al layer in the first electrode fingers and the second electrode fingers of the IDT electrode, the LT film thickness, the Pt film thickness, and the Al film thickness are in ranges where the optimum duty ratio is from 0.62 to 0.73 in Formula 3 below:

OPTIMUM DUTY RATIO $= 0.706311420324445$      FORMULA 3

$+0.0515443705199995 \times (($"LT FILM THICKNESS $[\lambda]$"$) - 0.3)$ $+0.340692430577689 \times (($"Al FILM THICKNESS $[\lambda]$"$) - 0.0750000000000001)$ $+1.92242704222223 \times (($"Pt FILM THICKNESS $[\lambda]$"$) - 0.0125)$ $+(-0.1623038581645) \times ((($"LT FILM THICKNESS $[\lambda]$"$) - 0.3)$ $\times (($"LT FILM THICKNESS $[\lambda]$"$) - 0.3) - 0.0166666666666667)$ $+0.0686507973333415 \times (($"LT FILM THICKNESS $[\lambda]$"$) - 0.3)$ $\times (($"Al FILM THICKNESS $[\lambda]$"$) - 0.0750000000000001)$ $+5.08720585142787 \times ((($"Al FILM THICKNESS $[\lambda]$"$) - 0.0750000000000001)$ $\times (($"Al FILM THICKNESS $[\lambda]$"$) - 0.0750000000000001) - 0.0003125)$ $+0.292474862666682 \times (($"LT FILM THICKNESS $[\lambda]$"$) - 0.3)$ $\times (($"Pt FILM THICKNESS $[\lambda]$"$) - 0.0125)$ $+(-22.1884852444445) \times (($"Al FILM THICKNESS $[\lambda]$"$) - 0.0750000000000001)$ $\times (($"Pt FILM THICKNESS $[\lambda]$"$) - 0.0125)$ $+-63.3669675555578 \times ((($"Pt FILM THICKNESS $[\lambda]$"$) - 0.0125)$ $\times (($"Pt FILM THICKNESS $[\lambda]$"$) - 0.0125) - 0.00005).$

14. The acoustic wave device according to claim 2, wherein the IDT electrode includes a W layer stacked on the piezoelectric layer and an Al layer stacked on the W layer; and when an optimum duty ratio is a duty ratio in the first edge region and the second edge region at which an acoustic velocity in the first edge region and the second edge region is lowest, an LT film thickness is a film thickness of the piezoelectric layer, and a W film thickness and an Al film thickness are respectively a film thickness of the W layer and a film thickness of the Al layer in the first electrode fingers and the second electrode fingers of the IDT electrode, the LT film thickness, the W film thickness, and the Al film thickness are in ranges where the optimum duty ratio is from 0.62 to 0.73 in Formula 4 below:

OPTIMUM DUTY RATIO = 0.670366655408889      FORMULA 4

$+0.0569799749733328 \times (("LT\ FILM\ THICKNESS\ [\lambda]") - 0.3)$ $+0.601791697955469 \times (("Al\ FILM\ THICKNESS\ [\lambda]") - 0.0750000000000001)$ $+0.0898163408888796 \times (("W\ FILM\ THICKNESS\ [\lambda]") - 0.0125)$ $+(-0.186654102147184) \times ((("LT\ FILM\ THICKNESS\ [\lambda]") - 0.3)$ $\times (("LT\ FILM\ THICKNESS\ [\lambda]") - 0.3) - 0.0166666666666666667)$ $+0.00960756266667166 \times (("LT\ FILM\ THICKNESS\ [\lambda]") - 0.3)$ $\times (("Al\ FILM\ THICKNESS\ [\lambda]") - 0.0750000000000001)$ $+4.24356009650733 \times ((("Al\ FILM\ THICKNESS\ [\lambda]") - 0.0750000000000001)$ $\times (("Al\ FILM\ THICKNESS\ [\lambda]") - 0.0750000000000001) - 0.0003125)$ $+0.54235624266667 \times (("LT\ FILM\ THICKNESS\ [\lambda]") - 0.3)$ $\times (("W\ FILM\ THICKNESS\ [\lambda]") - 0.0125)$ $+(-19.6658167822222) \times (("Al\ FILM\ THICKNESS\ [\lambda]") - 0.0750000000000001)$ $\times (("W\ FILM\ THICKNESS\ [\lambda]") - 0.0125)$ $+15.4875977777752 \times ((("W\ FILM\ THICKNESS\ [\lambda]") - 0.0125)$ $\times (("W\ FILM\ THICKNESS\ [\lambda]") - 0.0125) - 0.00005).$

15. The acoustic wave device according to claim 2, wherein the IDT electrode includes a Mo layer stacked on the piezoelectric layer and an Al layer stacked on the Mo layer; and first electrode fingers and the second electrode fingers of the IDT electrode, the LT film thickness, the Mo film thickness, and the Al film thickness are in ranges so that the optimum duty ratio is from 0.62 to 0.73 in Formula 5 below:

OPTIMUM DUTY RATIO = 0.650578355337778      FORMULA 5

$+0.0565759044933328 \times (("LT\ FILM\ THICKNESS\ [\lambda]") - 0.3)$ $+0.896476823999908 \times (("Al\ FILM\ THICKNESS\ [\lambda]") - 0.0750000000000001)$ $+(-0.835424887999999) \times (("Mo\ FILM\ THICKNESS\ [\lambda]") - 0.0125)$ $+(-0.182142102839825) \times ((("LT\ FILM\ THICKNESS\ [\lambda]") - 0.3)$ $\times (("LT\ FILM\ THICKNESS\ [\lambda]") - 0.3) - 0.0166666666666666667)$ $+(-0.0337296554666596) \times (("LT\ FILM\ THICKNESS\ [\lambda]") - 0.3)$ $\times (("Al\ FILM\ THICKNESS\ [\lambda]") - 0.0750000000000001)$ $+3.10610546793597 \times ((("Al\ FILM\ THICKNESS\ [\lambda]") - 0.0750000000000001)$ $\times (("Al\ FILM\ THICKNESS\ [\lambda]") - 0.0750000000000001) - 0.0003125)$ $+0.286014725333341 \times (("LT\ FILM\ THICKNESS\ [\lambda]") - 0.3)$ $\times (("Mo\ FILM\ THICKNESS\ [\lambda]") - 0.0125)$ $+(-8.1523516622225) \times (("Al\ FILM\ THICKNESS\ [\lambda]") - 0.0750000000000001)$ $\times (("Mo\ FILM\ THICKNESS\ [\lambda]") - 0.0125)$ $+63.3934203174576 \times ((("W\ FILM\ THICKNESS\ [\lambda]") - 0.0125)$ $\times (("Mo\ FILM\ THICKNESS\ [\lambda]") - 0.0125) - 0.00005).$ when an optimum duty ratio is a duty ratio in the first edge region and the second edge region at which an acoustic velocity in the first edge region and the second edge region is lowest, an LT film thickness is a film thickness of the piezoelectric layer, and a Mo film thickness and an Al film thickness are respectively a film thickness of the Mo layer and a film thickness of the Al layer in the

16. The acoustic wave device according to claim 3, wherein the IDT electrode includes a main electrode layer;

the main electrode layer is an Al layer or an AlCu layer;

a Cu content percentage of the main electrode layer is less than or equal to 2 wt %; and when an optimum duty ratio is a duty ratio in the first edge
   region and the second edge region at which an acoustic
   velocity in the first edge region and the second edge
   region is lowest, an LT film thickness is a film thickness
   of the piezoelectric layer, and an electrode film thick-
   ness is a film thickness of the main electrode layer in
   the first electrode fingers and the second electrode
   fingers of the IDT electrode, the LT film thickness and
   the electrode film thickness are within ranges where the
   optimum duty ratio is from 0.62 to 0.73 in Formula 1
   below:

OPTIMUM DUTY RATIO = 0.66831566544375                FORMULA 1

$+0.821829726029454 \times (("ELECTRODE\ FILM\ THICKNESS\ [\lambda]") - 0.0625000000000001)$ $+0.0377723825227273 \times (("LT\ FILM\ THICKNESS\ [\lambda]") - 0.275)$ $+5.41169053151292 \times ((("ELECTRODE\ FILM\ THICKNESS\ [\lambda]") - 0.0625000000000001)$ $\times (("ELECTRODE\ FILM\ THICKNESS\ [\lambda]") - 0.0625000000000001) - 0.00053125)$ $+(-0.325118002174692) \times ((("ELECTRODE\ FILM\ THICKNESS\ [\lambda]") - 0.0625000000000001)$ $\times (("LT\ FILM\ THICKNESS\ [\lambda]") - 0.275))$ $+(-0.0722908233901528) \times ((("LT\ FILM\ THICKNESS\ [\lambda]") - 0.275))$ $\times (("LT\ FILM\ THICKNESS\ [\lambda]") - 0.275) - 0.020625).$

17. The acoustic wave device according to claim 3,
wherein the IDT electrode includes a Cu layer; and
   when an optimum duty ratio is a duty ratio in the first edge
      region and the second edge region at which an acoustic
      velocity in the first edge region and the second edge
      region is lowest, an LT film thickness is a film thickness
      of the piezoelectric layer, and a Cu film thickness is a
      film thickness of the Cu layer in the first electrode
      fingers and the second electrode fingers of the IDT
      electrode, the LT film thickness and the Cu film thick-
      ness are within ranges where the optimum duty ratio is
      from 0.62 to 0.73 in Formula 2 below:

OPTIMUM DUTY RATIO = 0.722361035255556            FORMULA 2

$+0.0561123231333331 \times (("LT\ FILM\ THICKNESS\ [\lambda]") - 0.3)$ $+0.450142117104374 \times (("Cu\ FILM\ THICKNESS\ [\lambda]") - 0.055)$ $+(-0.189939099134199) \times ((("LT\ FILM\ THICKNESS\ [\lambda]") - 0.3)$ $\times (("LT\ FILM\ THICKNESS\ [\lambda]") - 0.3) - 0.0166666666666667)$ $+0.0947647208080766 \times (("LT\ FILM\ THICKNESS\ [\lambda]") - 0.3)$ $\times (("Cu\ FILM\ THICKNESS\ [\lambda]") - 0.055)$ $+5.94554881734021 \times ((("Cu\ FILM\ THICKNESS\ [\lambda]") - 0.055)$ $\times (("Cu\ FILM\ THICKNESS\ [\lambda]") - 0.055) - 0.000824999999999999).$

18. The acoustic wave device according to claim 3,
wherein
   the IDT electrode includes a Pt layer stacked on the
      piezoelectric layer and an Al layer stacked on the Pt
      layer; and
   when an optimum duty ratio is a duty ratio in the first edge
      region and the second edge region at which an acoustic
      velocity in the first edge region and the second edge
      region is lowest, an LT film thickness is a film thickness
of the piezoelectric layer, and a Pt film thickness and an
Al film thickness are respectively a film thickness of
the Pt layer and a film thickness of the Al layer in the
first electrode fingers and the second electrode fingers
of the IDT electrode, the LT film thickness, the Pt film
thickness, and the Al film thickness are in ranges where
the optimum duty ratio is from 0.62 to 0.73 in Formula
3 below:

OPTIMUM DUTY RATIO = 0.706311420324445                                          FORMULA 3

$+0.0515443705199995 \times (("LT\ FILM\ THICKNESS\ [\lambda]") - 0.3)$ $+0.340692430577689 \times (("Al\ FILM\ THICKNESS\ [\lambda]") - 0.0750000000000001)$ $+1.92242704222223 \times (("Pt\ FILM\ THICKNESS\ [\lambda]") - 0.0125)$ $+(-0.1623038581645) \times ((("LT\ FILM\ THICKNESS\ [\lambda]") - 0.3)$ $\times (("LT\ FILM\ THICKNESS\ [\lambda]") - 0.3) - 0.0166666666666667)$ $+0.0686507973333415 \times (("LT\ FILM\ THICKNESS\ [\lambda]") - 0.3)$ $\times (("Al\ FILM\ THICKNESS\ [\lambda]") - 0.0750000000000001)$ $+5.08720585142787 \times ((("Al\ FILM\ THICKNESS\ [\lambda]") - 0.0750000000000001)$ $\times (("Al\ FILM\ THICKNESS\ [\lambda]") - 0.0750000000000001) - 0.0003125)$ $+0.292474862666682 \times (("LT\ FILM\ THICKNESS\ [\lambda]") - 0.3)$ $\times (("Pt\ FILM\ THICKNESS\ [\lambda]") - 0.0125)$ $+(-22.1884852444445) \times (("Al\ FILM\ THICKNESS\ [\lambda]") - 0.0750000000000001)$ $\times (("Pt\ FILM\ THICKNESS\ [\lambda]") - 0.0125)$ $+ -63.3669675555578 \times ((("Pt\ FILM\ THICKNESS\ [\lambda]") - 0.0125)$ $\times (("Pt\ FILM\ THICKNESS\ [\lambda]") - 0.0125) - 0.00005).$

19. The acoustic wave device according to claim 3, wherein
the IDT electrode includes a W layer stacked on the piezoelectric layer and an Al layer stacked on the W layer; and first electrode fingers and the second electrode fingers of the IDT electrode, the LT film thickness, the W film thickness, and the Al film thickness are in ranges where the optimum duty ratio is from 0.62 to 0.73 in Formula 4 below:

OPTIMUM DUTY RATIO = 0.670366655408889                                          FORMULA 4

$+0.0569799749733328 \times (("LT\ FILM\ THICKNESS\ [\lambda]") - 0.3)$ $+0.601791697955469 \times (("Al\ FILM\ THICKNESS\ [\lambda]") - 0.0750000000000001)$ $+0.0898163408888796 \times (("W\ FILM\ THICKNESS\ [\lambda]") - 0.0125)$ $+(-0.186654102147184) \times ((("LT\ FILM\ THICKNESS\ [\lambda]") - 0.3)$ $\times (("LT\ FILM\ THICKNESS\ [\lambda]") - 0.3) - 0.0166666666666666667)$ $+0.00960756266667166 \times (("LT\ FILM\ THICKNESS\ [\lambda]") - 0.3)$ $\times (("Al\ FILM\ THICKNESS\ [\lambda]") - 0.0750000000000001)$ $+4.24356009650733 \times ((("Al\ FILM\ THICKNESS\ [\lambda]") - 0.0750000000000001)$ $\times (("Al\ FILM\ THICKNESS\ [\lambda]") - 0.0750000000000001) - 0.0003125)$ $+0.54235624266667 \times (("LT\ FILM\ THICKNESS\ [\lambda]") - 0.3)$ $\times (("W\ FILM\ THICKNESS\ [\lambda]") - 0.0125)$ $+(-19.6658167822222) \times (("Al\ FILM\ THICKNESS\ [\lambda]") - 0.0750000000000001)$ $\times (("W\ FILM\ THICKNESS\ [\lambda]") - 0.0125)$ $+15.4875977777752 \times ((("W\ FILM\ THICKNESS\ [\lambda]") - 0.0125)$ $\times (("W\ FILM\ THICKNESS\ [\lambda]") - 0.0125) - 0.00005).$ when an optimum duty ratio is a duty ratio in the first edge region and the second edge region at which an acoustic velocity in the first edge region and the second edge region is lowest, an LT film thickness is a film thickness of the piezoelectric layer, and a W film thickness and an Al film thickness are respectively a film thickness of the W layer and a film thickness of the Al layer in the

20. The acoustic wave device according to claim 3, wherein
the IDT electrode includes a Mo layer stacked on the piezoelectric layer and an Al layer stacked on the Mo layer; and
when an optimum duty ratio is a duty ratio in the first edge region and the second edge region at which an acoustic velocity in the first edge region and the second edge region is lowest, an LT film thickness is a film thickness of the piezoelectric layer, and a Mo film thickness and an Al film thickness are respectively a film thickness of the Mo layer and a film thickness of the Al layer in the first electrode fingers and the second electrode fingers of the IDT electrode, the LT film thickness, the Mo film thickness, and the Al film thickness are in ranges so that the optimum duty ratio is from 0.62 to 0.73 in Formula 5 below:

$$\text{OPTIMUM DUTY RATIO} = 0.650578355337778 \qquad \text{FORMULA 5}$$

$$+0.0565759044933328 \times (("LT\ FILM\ THICKNESS\ [\lambda]") - 0.3)$$

$$+0.896476823999908 \times (("Al\ FILM\ THICKNESS\ [\lambda]") - 0.0750000000000001)$$

$$+(-0.835424887999999) \times (("Mo\ FILM\ THICKNESS\ [\lambda]") - 0.0125)$$

$$+(-0.182142102839825) \times ((("LT\ FILM\ THICKNESS\ [\lambda]") - 0.3)$$

$$\times (("LT\ FILM\ THICKNESS\ [\lambda]") - 0.3) - 0.0166666666666666667)$$

$$+(-0.0337296554666596) \times (("LT\ FILM\ THICKNESS\ [\lambda]") - 0.3)$$

$$\times (("Al\ FILM\ THICKNESS\ [\lambda]") - 0.0750000000000001)$$

$$+3.10610546793597 \times ((("Al\ FILM\ THICKNESS\ [\lambda]") - 0.0750000000000001)$$

$$\times (("Al\ FILM\ THICKNESS\ [\lambda]") - 0.0750000000000001) - 0.0003125)$$

$$+0.286014725333341 \times (("LT\ FILM\ THICKNESS\ [\lambda]") - 0.3)$$

$$\times (("Mo\ FILM\ THICKNESS\ [\lambda]") - 0.0125)$$

$$+(-8.1523516622225) \times (("Al\ FILM\ THICKNESS\ [\lambda]") - 0.0750000000000001)$$

$$\times (("Mo\ FILM\ THICKNESS\ [\lambda]") - 0.0125)$$

$$+63.3934203174576 \times ((("W\ FILM\ THICKNESS\ [\lambda]") - 0.0125)$$

$$\times (("Mo\ FILM\ THICKNESS\ [\lambda]") - 0.0125) - 0.00005).$$

\* \* \* \* \*

35